US012648102B2

(12) United States Patent
Tsorng et al.

(10) Patent No.: US 12,648,102 B2
(45) Date of Patent: Jun. 2, 2026

(54) RELEASE LEVER MECHANISM FOR SERVER CHASSIS SLEDS

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Chia-Hung Kao, Taoyuan City (TW); Jun-Zhe Weng, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 181 days.

(21) Appl. No.: 18/600,456

(22) Filed: Mar. 8, 2024

(65) Prior Publication Data

US 2025/0287520 A1 Sep. 11, 2025

(51) Int. Cl.
*H05K 7/14* (2006.01)
(52) U.S. Cl.
CPC ......... *H05K 7/1409* (2013.01); *H05K 7/1489* (2013.01)
(58) Field of Classification Search
CPC .. H05K 7/1409; H05K 7/1487; H05K 7/1411; H05K 7/1489; G06F 1/183
See application file for complete search history.

(56) References Cited

U.S. PATENT DOCUMENTS

| | | | | | |
|---|---|---|---|---|---|
| 4,982,303 | A | * | 1/1991 | Krenz | G11B 33/124 |
| | | | | | 360/137 |
| 8,435,057 | B1 | * | 5/2013 | Jun | H05K 7/1409 |
| | | | | | 439/157 |

* cited by examiner

*Primary Examiner* — James Wu
(74) *Attorney, Agent, or Firm* — NIXON PEABODY LLP

(57) ABSTRACT

A compact lever mechanism for assisting in removing and inserting a sled in a chassis is disclosed. The lever mechanism has a longitudinal lever member. A spur gear having gear teeth is coupled to one end of the longitudinal lever member. An ejector component is rotatably connected to the sled. The ejector component has a frame defined by an internal gear support, a first support arm, and a second support arm. The spur gear is positioned within the frame and engages the internal gear support to rotate the ejector component. The first support arm includes a tab engaging a flange of the chassis to apply force to remove the sled from the chassis when rotated in a first direction. The second support arm includes a second tab engaging a cutout in the chassis to apply force to insert the sled in the chassis when rotated in a second direction.

18 Claims, 21 Drawing Sheets

RELEASE LEVER MECHANISM FOR SERVER CHASSIS SLEDS

TECHNICAL FIELD

The present disclosure relates generally to lever release mechanisms for sleds of computing devices. More particularly, aspects of this disclosure relate to a space saving lever mechanism that facilitates insertion and removal of device sleds from a chassis.

BACKGROUND

Computer systems (e.g., desktop computers, blade servers, rack-mount servers, etc.) are employed in large numbers in various applications. High demand applications, such as network based systems, data centers, or high density finite element simulations can push hardware of computing systems, and require servers with specialized capabilities. Modern server chassis designs allow flexibility in terms of capabilities and components. One method is to design bays that allow server sleds to be easily installed and be coupled to common network and power interfaces. Such sleds include processors, memories, and support circuits for a server on a tray or bottom panel. The back end of the sled typically includes connectors that are mated with compatible connectors on the chassis for power and electronic signals. In order for easy service of and/or changing components, sleds may be accessed without having to move the actual server chassis to access the components on the sled. For example, certain sleds may slide out from the chassis, allowing the installation or removal of a component on the sled or the replacement of the sled entirely. Once installation is complete, the sled may be pushed back into the chassis and resume operation. Thus, a sled will typically include release and locking mechanisms on a front end that allows the sled to be inserted and removed from the bay.

Currently sleds use mechanical devices to assist in providing force to ensure that the sleds are properly inserted so the connectors are plugged into the chassis. Conversely, the mechanical devices are used to provide additional force to unplug the connectors when the sleds are pulled out. For example, known sleds have rotatable levers that allow an operator to rotate the lever to an open position to provide force to disconnect the sled and allow the sled to be pulled out from the chassis. When the sled is pushed into the chassis, the lever is rotated to the closed position to provide force to plug in the connectors and fully insert the sled into the chassis. Thus, existing lever designs are a mechanical system where the lever rotates around a pin to translate force to disconnect various connectors between the sled to the chassis.

FIG. 1A and FIG. 1B show perspective views of a server chassis 10 with a sled 12. The chassis 10 has side walls 20 and 22 that define a bay for the sled 12. The end of the bay includes various connectors for connecting the sled 12 to power sources and data components of the chassis 10. The side walls 20 and 22 each have an edge element 24. The sled 12 includes known levers 30 and 32 that are used to assist in releasing the sled 12 from connection to a chassis 10. Rotating the levers such as the lever 30 shown in FIG. 1B provide force allowing the sled 12 to be pushed away from the chassis 10 through contact of an engagement end 40 of the lever 30 with the edge element 24 of the side wall 20. An opposite end 42 allows a user to grip the lever 30 to rotate the lever 30 and thus move the sled 12 out of the bay in the chassis 10.

FIG. 1C is a perspective view of the known lever 30. The lever 30 includes a main body 50 that defines the engagement end 40 and the opposite end 42. A handle 52 is attached to the opposite end 42 to allow a user to better engage the lever 30 to move the lever. The engagement end 40 includes a hole 54 that allows the insertion of a pin to create a hinge around which the lever 30 may be rotated. A tab 56 contacts the edge 24 to apply the force of rotating the lever 30 to linear force to push the sled 12 away from the chassis 10. An opposite tab 58 translates the force from the rotation of the lever 30 in the opposite direction to linear force to push the sled 12 into the chassis 10.

The known lever 30 provides force relative to the side wall 20 proportional to the length of the main body 50. Thus, such levers need to be longer to provide more force to insert or retract a sled. However, longer levers require more space on the front of the sled.

Thus, there is a need for a compact lever release mechanism that exerts sufficient force to attach or release a sled. There is a further need for a lever release mechanism that uses multiple gears to more efficiently use force applied by the lever.

SUMMARY

One disclosed example is a lever mechanism for insertion to and removal of a sled from a chassis. The lever mechanism has a longitudinal lever member having a release end and an opposite pivot end. A spur gear having gear teeth is coupled to the pivot end of the lever. The spur gear is rotated by rotating the longitudinal lever member. An ejector component is rotatably connectable to the sled. The ejector component has a frame defined by an internal gear support, a first support arm, and a second support arm. The spur gear is positioned within the frame and engages the internal gear support to rotate the ejector component. The first support arm includes a tab engaging a flange of the chassis to apply force to remove the sled from the chassis when the longitudinal lever member is rotated in a first direction. The second support arm includes a second tab engaging a cutout of the chassis to apply force to insert the sled in the chassis when the longitudinal lever member is rotated in a second direction.

A further implementation of the example lever mechanism is an embodiment including a support plate rotatably attached to the spur gear and ejector component. A spring has one end connected to the support plate and an opposite end connected to the spur gear to bias the spur gear in the first rotational direction. Another implementation is where the release end of the longitudinal lever member includes a tab that engages a latch mechanism on the sled to hold the longitudinal lever member in place. Another implementation is where the latch mechanism rotates between a position engaging the tab and a position releasing the tab. Another implementation is where the release end of the longitudinal lever member includes a handle. Another implementation is where the spur gear is connected to a cylindrical support, and the longitudinal lever member is connected to the cylindrical support. Another implementation is where the longitudinal lever member, spur gear, and ejection component generate force to disconnect connectors of the sled from connectors of the chassis when rotated in the first direction.

Another disclosed example is a sled for insertion into a bay of a chassis defined by two edge members each having a flange and a cutout. The sled includes a tray holding electronic components. A front panel is coupled perpendicularly to the tray. A first lever mechanism is mounted on a side of the front panel. The first lever mechanism includes a longitudinal lever member having a release end and an opposite pivot end. A spur gear having gear teeth is coupled to the pivot end of the longitudinal lever member. The spur gear is rotated by rotating the longitudinal lever member. An ejector component is rotatably connected to the sled. The ejector component has a frame defined by an internal gear support, a first support arm, and a second support arm. The spur gear is positioned within the frame and engages the internal gear support to rotate the ejector component. The first support arm includes a tab engaging one of the flanges to apply force to remove the sled from the bay when the longitudinal lever member is rotated in a first direction. The second support arm includes a second tab engaging one of the cutouts to apply force to insert the sled in the bay when the longitudinal lever member is rotated in a second direction.

A further implementation of the example sled is an embodiment including a second lever mechanism mounted on an opposite side of the front panel. The second lever mechanism includes a longitudinal lever member having a release end and an opposite pivot end. A spur gear having gear teeth is coupled to the pivot end of the longitudinal lever member. An ejector component is rotatably connected to the sled. The ejector component has a frame defined by an internal gear support, a first support arm, and a second support arm. The spur gear is positioned within the frame and engages the internal gear support to rotate the ejector component. The first support arm includes a tab engaging the other one of the flanges to apply force to remove the sled from the bay when the longitudinal lever member is rotated in a first direction. The second support arm includes a second tab engaging the other one of the cutouts to apply force to insert the sled in the bay when the longitudinal lever member is rotated in a second direction. Another implementation is where the first and second lever mechanisms generate sufficient force to disconnect connectors of the sled from connectors of the bay when rotated in the first direction. Another implementation is where the sled includes a support plate rotatably attached to the spur gear and ejector component. A spring has one end connected to the support plate and an opposite end connected to the spur gear to bias the spur gear in the first rotational direction. Another implementation is where the sled further includes a latch mechanism on the front panel. The release end of the longitudinal lever member includes a tab that engages the latch mechanism to hold the longitudinal lever member in place. Another implementation is where the latch mechanism rotates between a position engaging the tab and a position releasing the tab. Another implementation is where the release end of the longitudinal lever member includes a handle. Another implementation is where the spur gear is connected to a cylindrical support, and wherein the longitudinal lever member is connected to the cylindrical support.

Another disclosed example is a computer system comprising a chassis having two side walls and a shelf between the two side walls. A bay is defined by the two side walls and the shelf. Each of the side walls have edge members with longitudinal flanges. A sled is insertable in the bay of the chassis between the two side walls. The sled includes a front panel, a tray, and a first rotating lever mechanism on the front panel. The first rotating lever mechanism includes a longitudinal lever member having a release end and an opposite pivot end. A spur gear has gear teeth coupled to the pivot end of the longitudinal lever member. An ejector component is rotatably connected to the sled. The ejector component has a frame defined by an internal gear support, a first support arm, and a second support arm. The spur gear is positioned within the frame and engages the internal gear support to rotate the ejector component. The first support arm includes a tab engaging one of the longitudinal flanges to apply force to remove the sled from the bay when the longitudinal lever member is rotated in a first direction. The second support arm includes a second tab engaging a cutout on one of side walls to apply force to insert the sled in the bay when the longitudinal lever member is rotated in a second direction.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
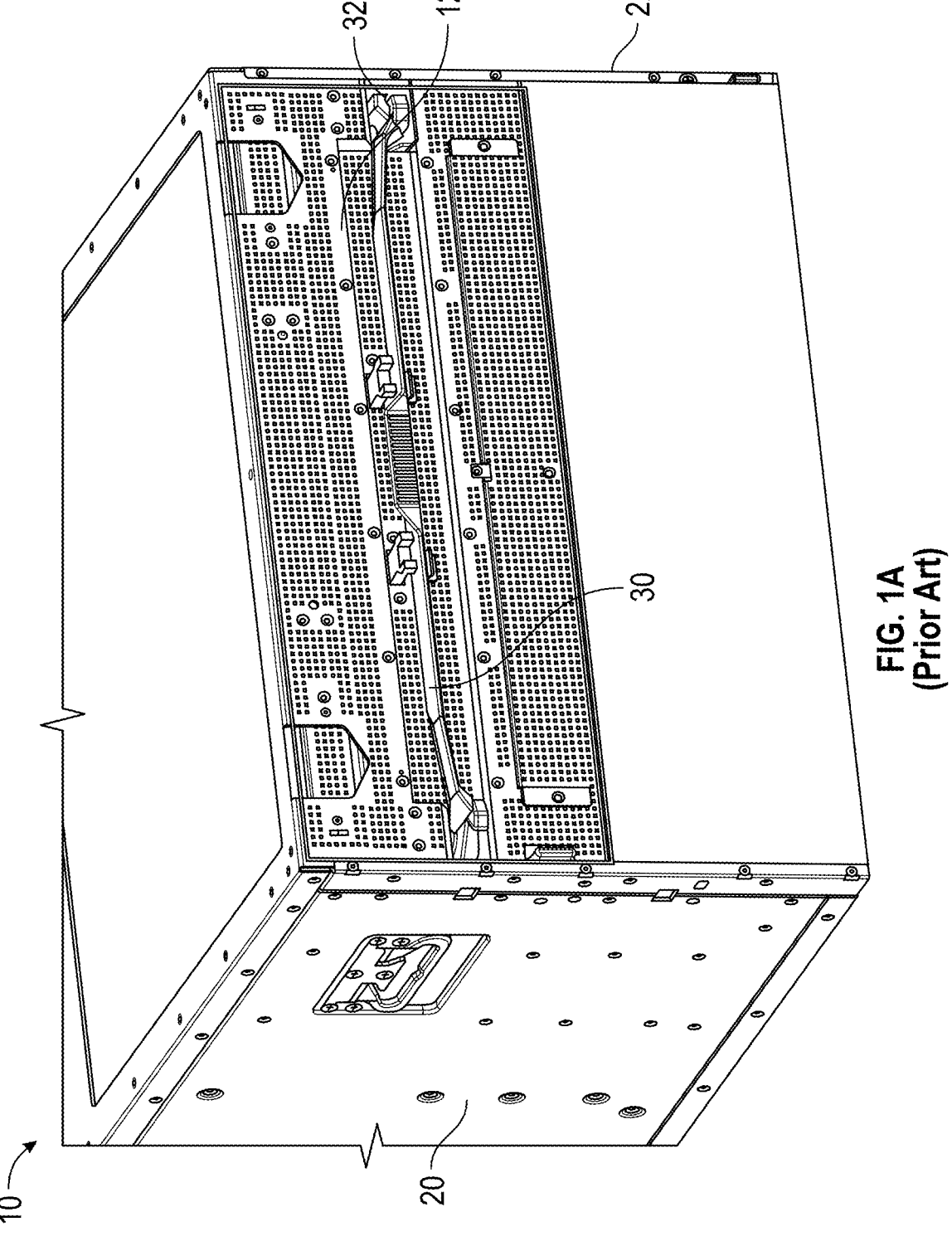
FIG. 1A is a front view of a server component with a prior art release lever.
Figure 1B:
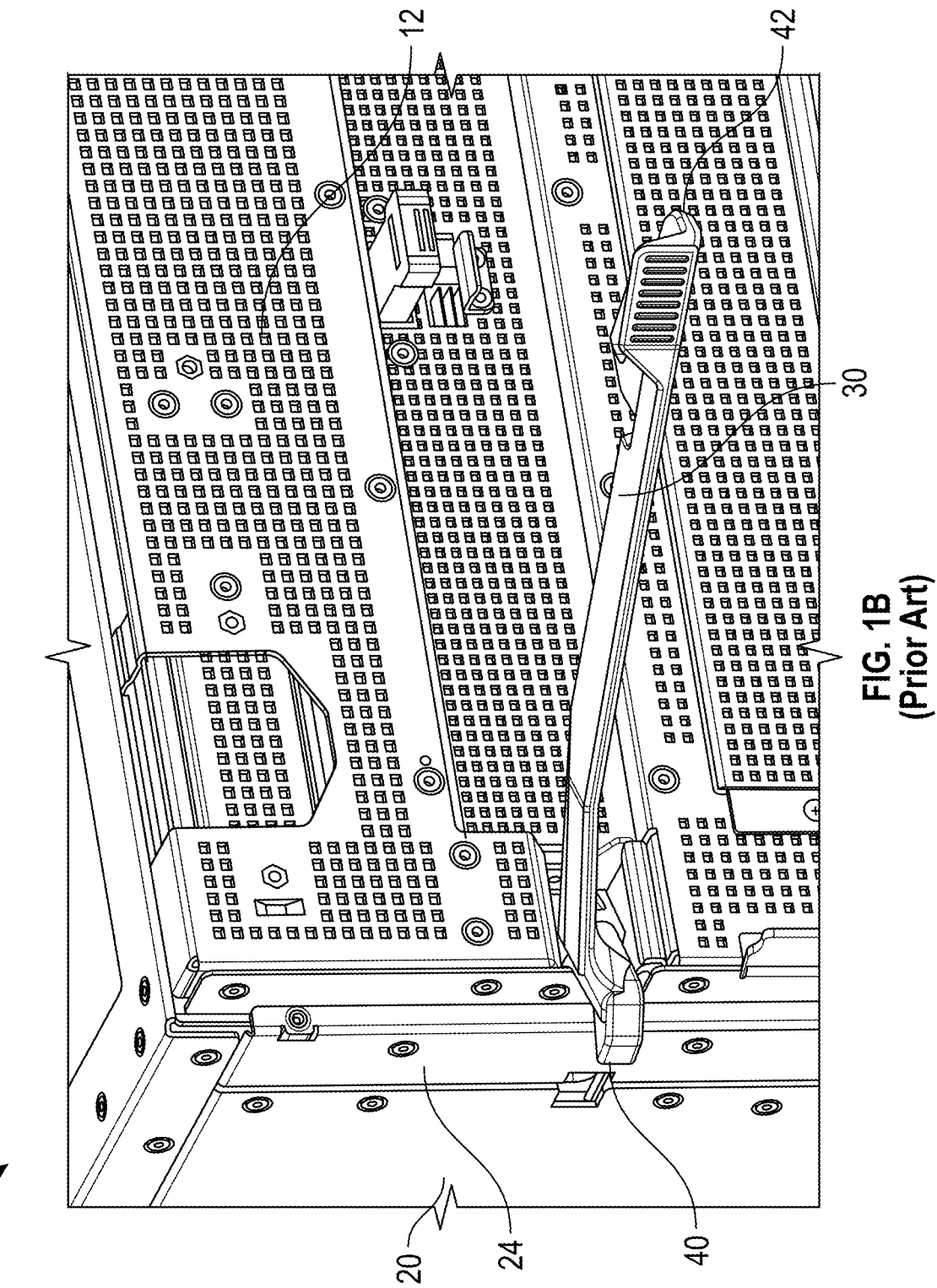
FIG. 1B is a close up perspective view of the prior art release lever in an open position.
Figure 1C:
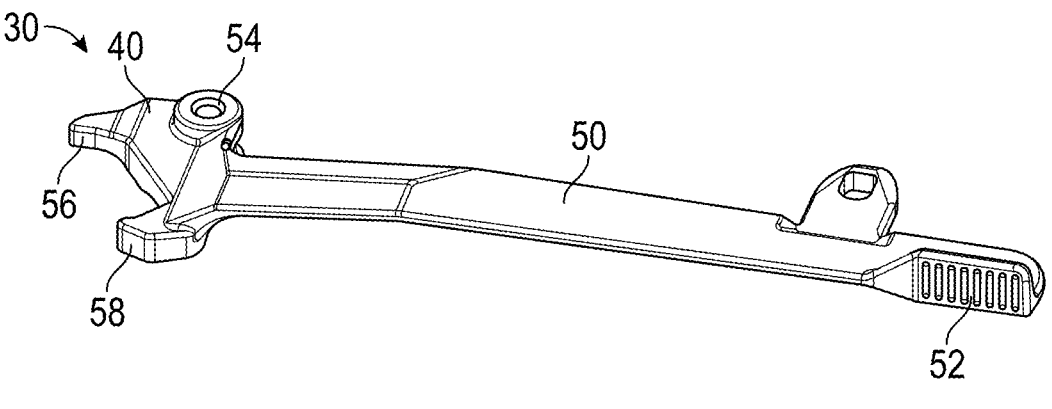
FIG. 1C is an isolated perspective view of the prior art release lever in FIG. 1A.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a lever release mechanism for a component sled that uses an internal spur gear in conjunction with gearing of an ejector structure to assist in inserting or releasing the sled from a bay of a chassis. The ejector structure has a frame that contains the internal spur gear. Both the ejector structure and internal spur gear are rotationally mounted on a mounting plate of the sled. The example lever release mechanism generates greater force from leveraging the spur gear driving an internal gear of the ejector structure. Due to the use of multiple gears to efficiently translate rotational force, the example lever release mechanism is more compact than known release levers.

Figure 2A:
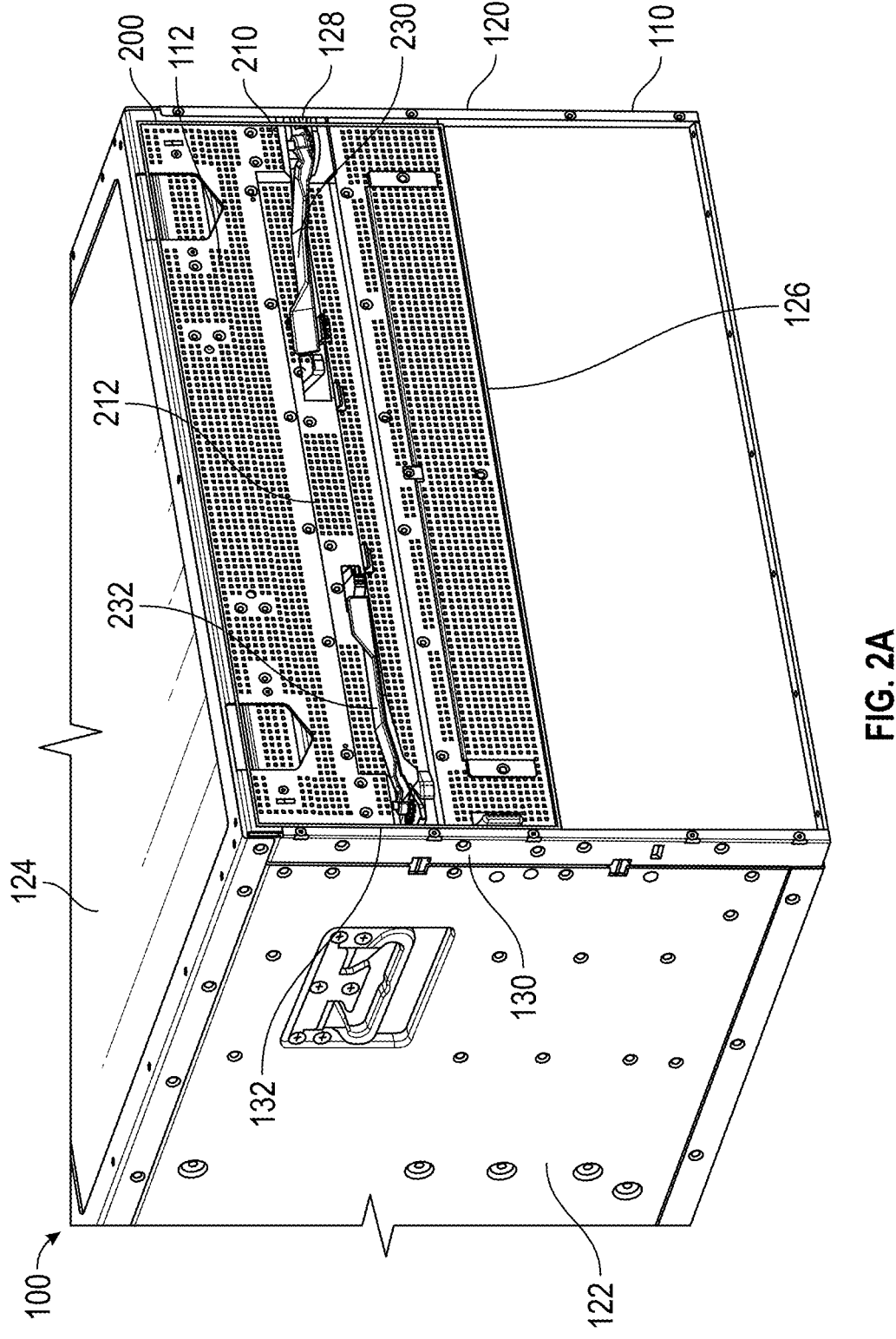
FIG. 2A is a perspective view of a computer system with example release lever mechanisms on a sled, according to certain aspects of the present disclosure.

FIG. 2A shows a perspective view of a computer system 100 that includes a server chassis 110 with a sled 200. The sled 200 has a roughly rectangular structure that includes a roughly rectangular tray or bottom panel. The sled holds a motherboard that supports one or more components such as power supplies, processors such as CPUs, network interface cards, memory devices, and the like. The chassis 110 has side walls 120 and 122. The side walls are joined by a top panel 124 and a shelf 126 that define a bay 128 for the sled 200. The end of the bay 128 includes various connectors (not shown) for connecting the sled 200 to power sources and data components of the chassis 110. The side wall 122 has an edge member 130. The edge member 130 includes a lateral flange 132 that extends the length of the chassis 110. A corresponding edge member (not shown) is provided for the side wall 120. The edge member 130 provides additional structural strength for the chassis 110.

Figure 2B:
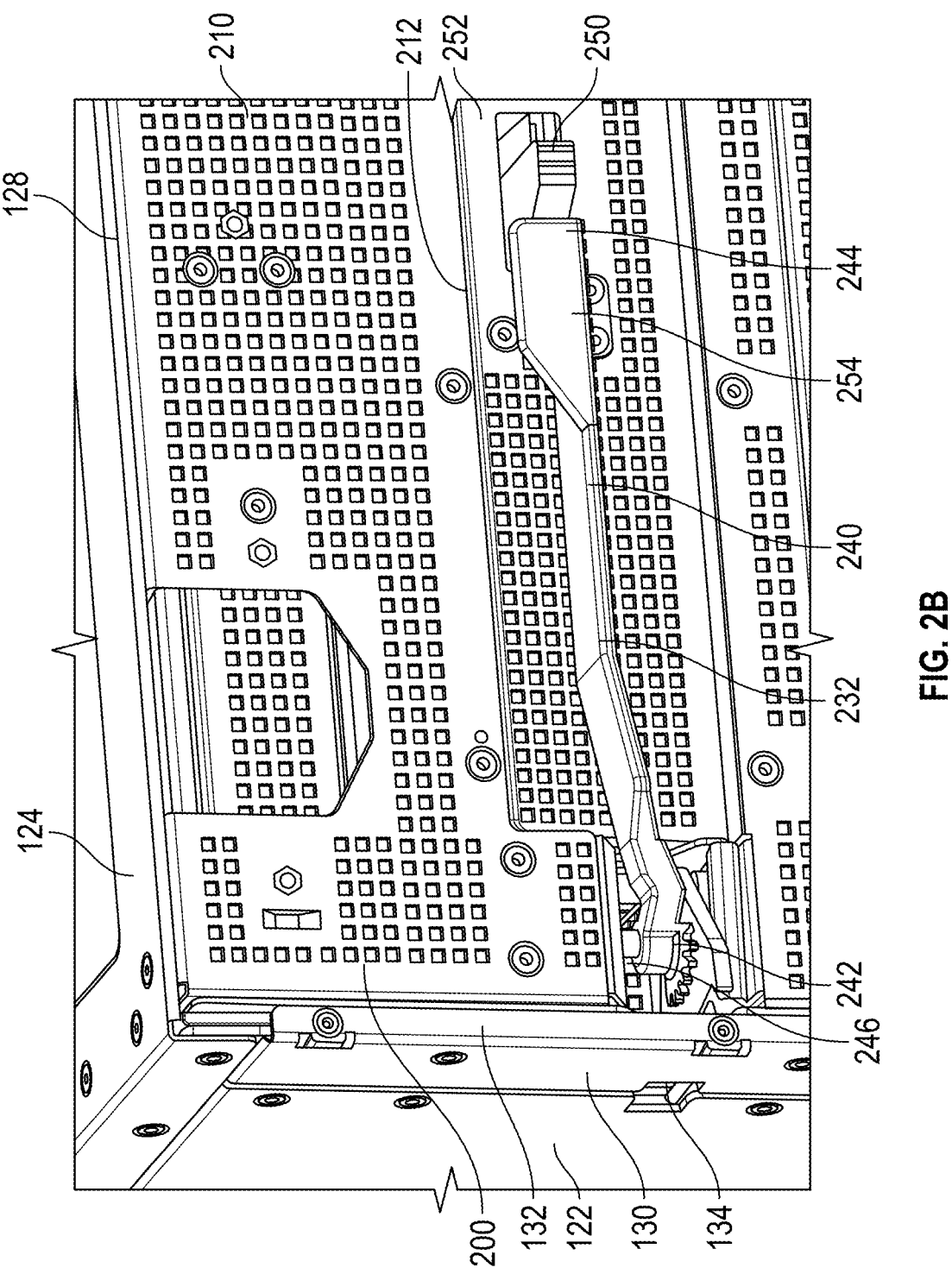
FIG. 2B is a close up perspective view of one of the example lever mechanisms in FIG. 2A in a closed position, according to certain aspects of the present disclosure.

FIG. 2B is a close up perspective view of the sled 200 when fully inserted into the bay 128 of the chassis 110. The sled 200 includes a front end 210 that has a series of panels including an upper panel 212. Each of the panels of the front end 210 such as the upper panel 212 have ventilation holes to allow air flow to the internal components on the motherboard of the sled 200. An opposite rear end (not shown) of the sled 200 has a series of connectors that, when connected to corresponding connectors at the rear of the bay 128, receive power and data signals from the chassis 110.

Figure 2C:
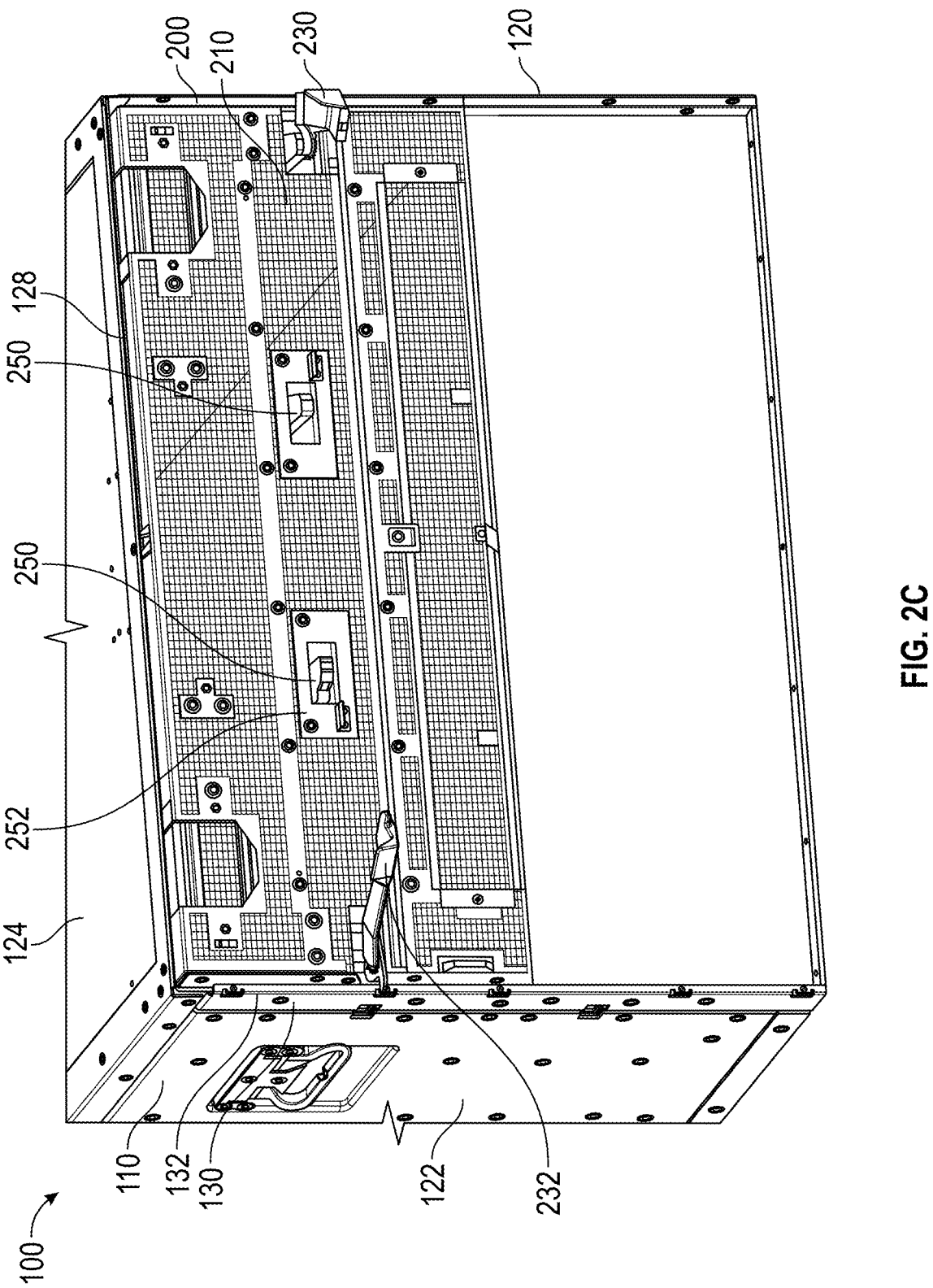
FIG. 2C is a perspective view of the computer system in FIG. 2A with the example release lever mechanisms in an open position, according to certain aspects of the present disclosure.
Figure 2D:
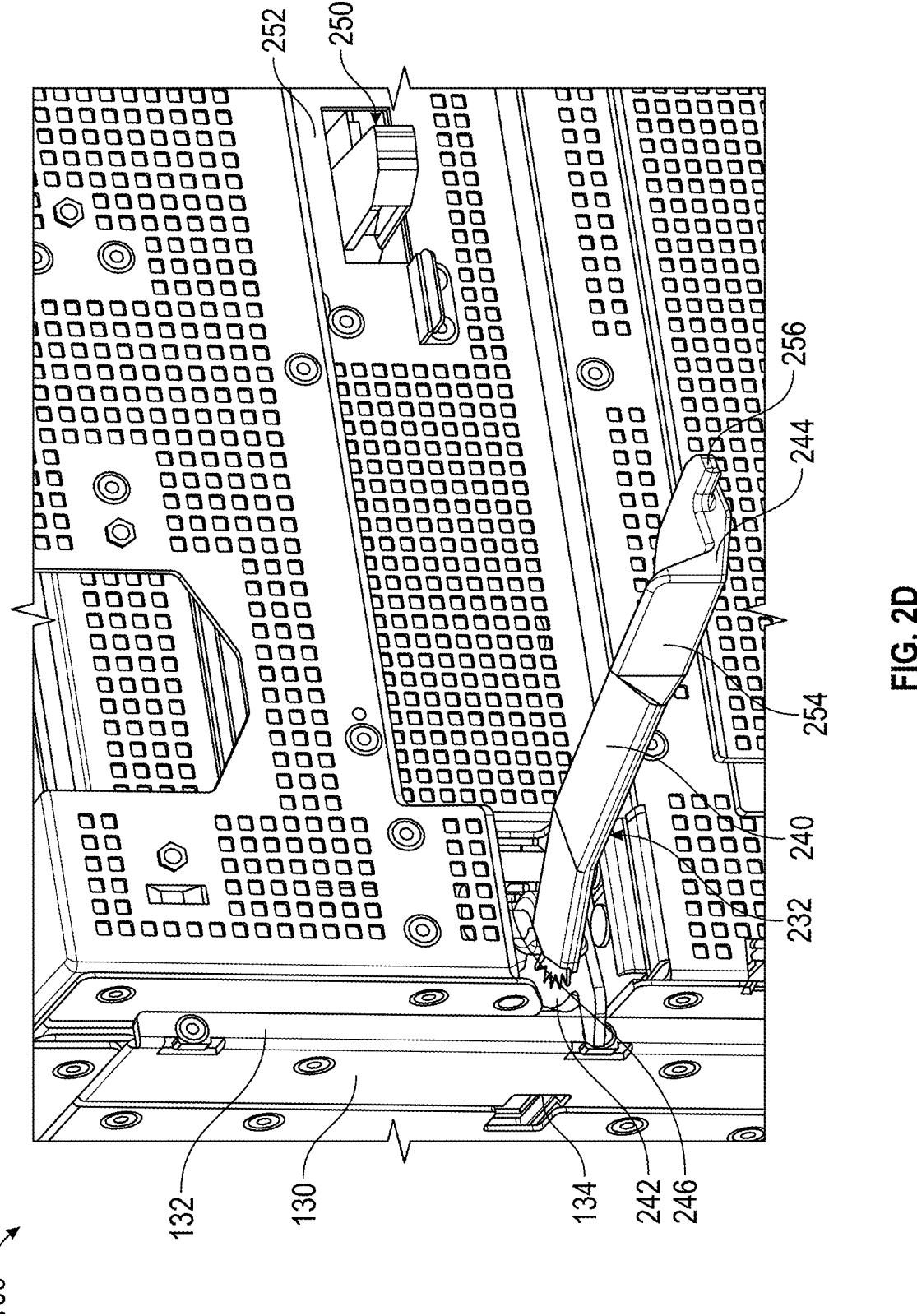
FIG. 2D is a close up perspective view of one of the example lever mechanisms in FIG. 2A in an open position, according to certain aspects of the present disclosure.

As shown in FIG. 2A, the front end 210 of the sled 200 includes lever mechanisms 230 and 232 that are used to assist in releasing the sled 200 from the bay 128 of the chassis 110. A cutout 134 is positioned on the edge members 130 in alignment with the example lever mechanisms 230 and 232. The lever mechanisms 230 and 232 are shown in a closed position in FIG. 2A when the sled 200 is entirely inserted in the bay 128. The lever mechanisms 230 and 232 are identical and thus their respective components will be labeled with common reference numerals in the description herein. The lever mechanisms 230 and 232 may be rotated outward to provide force to allow the sled 200 to be pulled away from the chassis 110 as shown in FIG. 2C. FIG. 2D is a close up perspective view of the sled 200 when it is partially pulled away from the bay 128 and the lever mechanism 232 is in an open or released position.

FIGS. 2B and 2D are a perspective view of the example lever mechanism 232 on the sled 200 in respective closed and open positions. The lever mechanism 232 has a longitudinal body member 240 that includes a pivot end 242 and a release end 244. The longitudinal body member 240 thus defines the lever of the lever mechanism 232. The pivot end 242 is rotatably attached to a recessed support plate 246 on a side of the front end 210 of the sled 200. The release end 244 is held via a latch mechanism 250 that extends from a support plate 252 that is part of the upper panel 212. The release end 244 includes a perpendicular handle 254 to allow a user to better engage the lever mechanism 230 to rotate the longitudinal body member 240 around the pivot end 242.

The latch mechanism 250 holds the lever mechanism 232 in the closed position in FIG. 2A via engaging a tab 256 that extends from the release end 244 as shown in FIG. 2D. When the latch mechanism 250 is released, the tab 256 is disengaged and thus the lever mechanism 232 is free to rotate away from the front end 210 of the sled 200 as shown in FIGS. 2C-2D. Spring force, as will be explained below, forces the lever mechanism 232 away from the upper panel 212. The longitudinal body member 240 of the lever mechanism 232 may then be rotated by a user to apply force to assist in disconnecting the connectors and thus allow the sled 200 to be pulled out of the bay 128.

Figure 3:
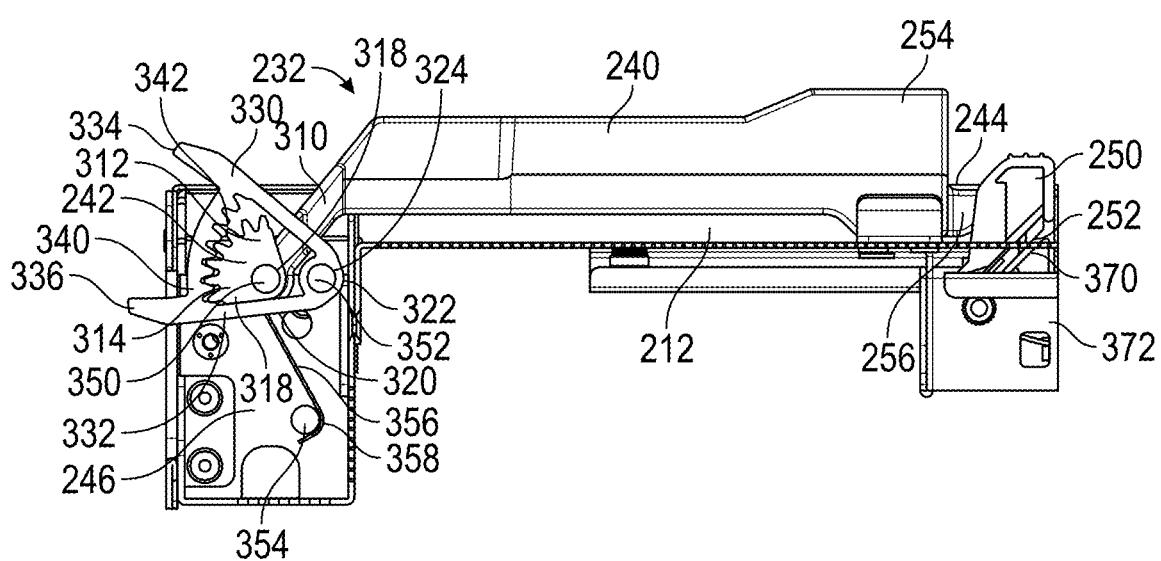
FIG. 3 is a bottom view of one of the example lever mechanisms in FIG. 2A, according to certain aspects of the present disclosure.

FIG. 3 is a bottom view of the example lever mechanism 232 in FIGS. 2A-2D. The components of the lever mechanism 232 is fabricated from high strength metal or alloy and are preferably press stamped. The longitudinal body member 240 is construed of generally rectangular plates that form a lever. The pivot end 242 includes a support strut 310 that is attached to a side of a semi-circular spur gear 312. The opposite side of the semi-circular spur gear 312 includes a semi-circular edge 314 with gear teeth. The semi-circular spur gear 312 includes a support cylinder 316 that has a hole 318 therethrough. The support cylinder 316 is joined to one end of the support strut 310. A pin inserted through the hole 318 allows the semi-circular spur gear 312 to rotate on the support cylinder 316 and thus translate rotational motion from the longitudinal body member 240 of the lever mechanism 232.

Figure 4:
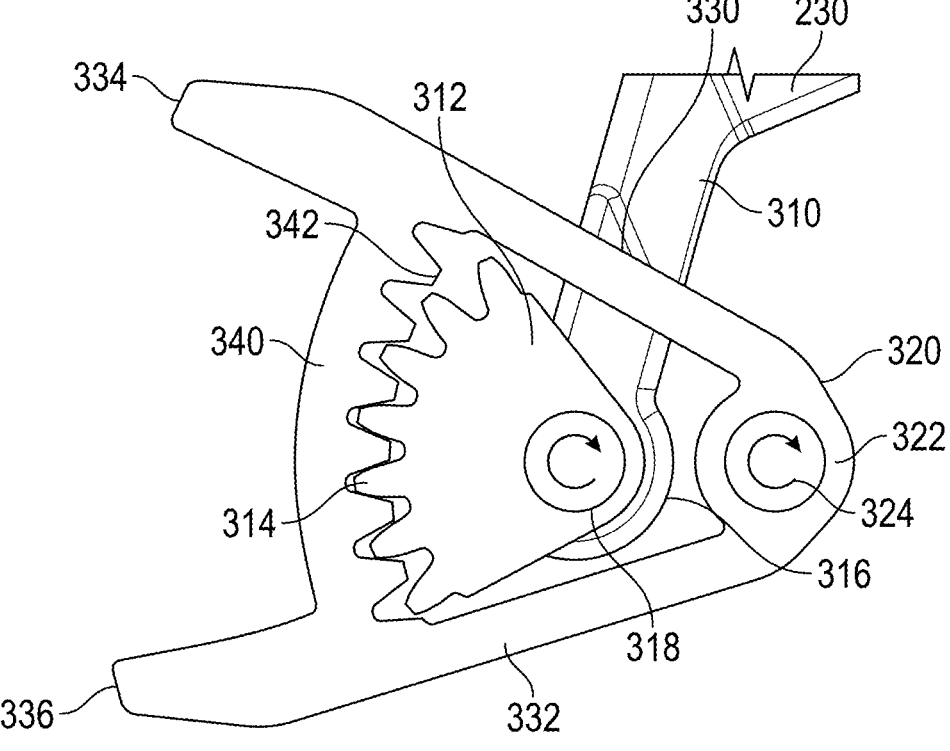
FIG. 4 is a close up view of the internal spur and internal gears of the example lever mechanism in FIG. 3, according to certain aspects of the present disclosure.

The semi-circular spur gear 312 is positioned within an ejector component 320. FIG. 4 is a close up view of the semi-circular spur gear 312 in relation to the ejector component 320. The ejector component 320 is a frame having a circular section 322 that has a hole 324 therethrough. A pin inserted through the hole 324 allows the ejector component 320 to be rotated. The ejector component 320 includes two angled support arms 330 and 332 that each have one end joined to the circular section 322. The opposite end of the support arm 330 is a tab 334. The opposite end of the support arm 332 is a tab 336. The support arms 330 and 332 are joined together by a circular internal gear member 340 near the tabs 334 and 336. The internal gear member 340 is semi-circular in shape and has an interior surface 342 with gear teeth. The gear teeth of the interior surface 342 engage the gear teeth of the semi-circular spur gear 312. Thus, the circular section 322, support arms 330 and 332, and internal gear member 340 form the frame shape of the ejector component 320. As shown in FIG. 4, the spur gear 312 is positioned within the frame shape formed by the circular section 322, support arms 330 and 332, and internal gear member 340.

Returning to FIG. 3, the recessed support plate 246 is attached in perpendicular orientation to the upper panel 212. The support plate 246 has a pin 350 for mounting and positioning the spur gear 312. Thus, the pin 350 is inserted in the hole 318 of the support cylinder 316. This allows the attached spur gear 312 to rotate around the pin 350. A second pin 352 on the support plate 246 is positioned in proximity to the pin 350. The circular section 322 of the ejector component 320 is attached to the support plate 246 via the pin 352. The pin 352 is inserted through the hole 324 of the circular section 322 and thus the ejector component 320 rotates around the pin 352. The positioning of the two pins 350 and 352 orients the spur gear 312 so the teeth of the semi-circular edge 314 mesh with the teeth on the interior surface 342 of the internal gear member 340 of the ejector component 320. Thus, rotational motion from the spur gear 312 is translated into rotational motion of the ejector component 320. Another pin 354 is positioned on the support plate 246 at a predetermined distance from the spur gear 312 and the ejector component 320. A spring 356 has a first end 358 that is wrapped around the pin 354. The coil of the spring 356 is wrapped around the pin 350. The spring force of the spring 356 rotates the spur gear 312 in a counter-clockwise direction, and is translated to rotating the ejector component 320.

The spring 356 is compressed when the lever mechanism 232 is in a closed position and held by the latch mechanism 250. The ejector component 320 thus is fixed in place and cannot rotate counter-clockwise. The latch mechanism 250 is attached to a mounting bracket 370 that is attached to the interior side of the support plate 252. The latch mechanism 250 extends through an aperture in the support plate 252 to hold the lever mechanism 232 in a closed position as shown in FIG. 2A.

Figure 5:
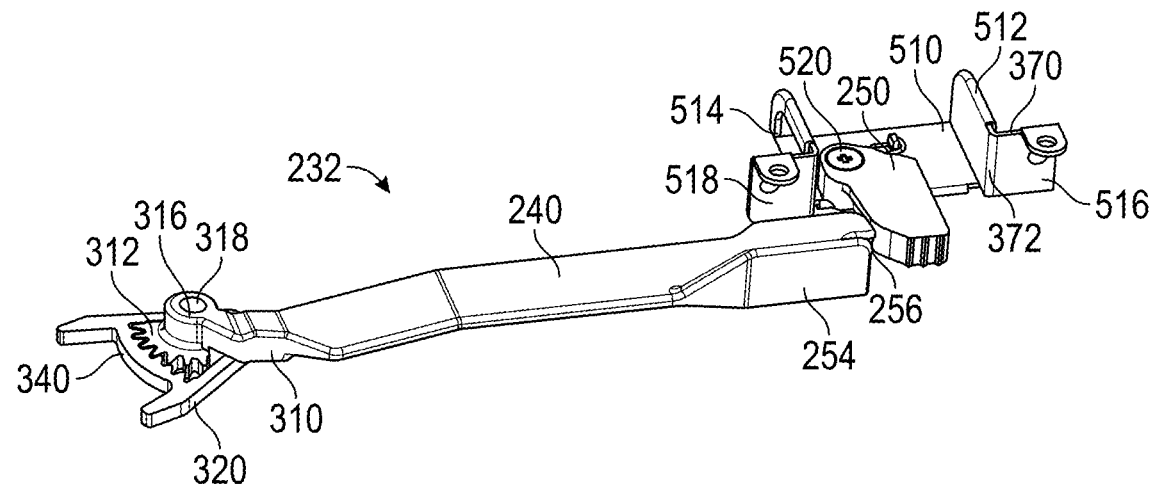
FIG. 5 is perspective view of one of the example lever mechanisms in FIG. 2A, according to certain aspects of the present disclosure.

FIG. 5 shows a perspective view of the lever mechanism 232 in relation to the respective latch mechanism 250 and the mounting bracket 370 that is joined to the upper panel 212 of the sled 200. The mounting bracket 370 has a plate 510 and perpendicular sides 512 and 514 with respective tabs 516 and 518 that allow the mounting bracket 370 to be attached to the support plate 252. The latch mechanism 250 is mounted on the mounting bracket 370 and oriented to extend from the support plate 252. The latch mechanism 250 rotates to engage the tab 256 of the lever mechanism 232. The latch mechanism 250 is secured to the mounting bracket 370 via a screw 520 that allows the latch mechanism 250 to be rotated. The latch mechanism 250 for the lever mechanism 230 in FIGS. 2A-3B is identical to the latch mechanism 250 shown in FIG. 5.

Figure 6A:
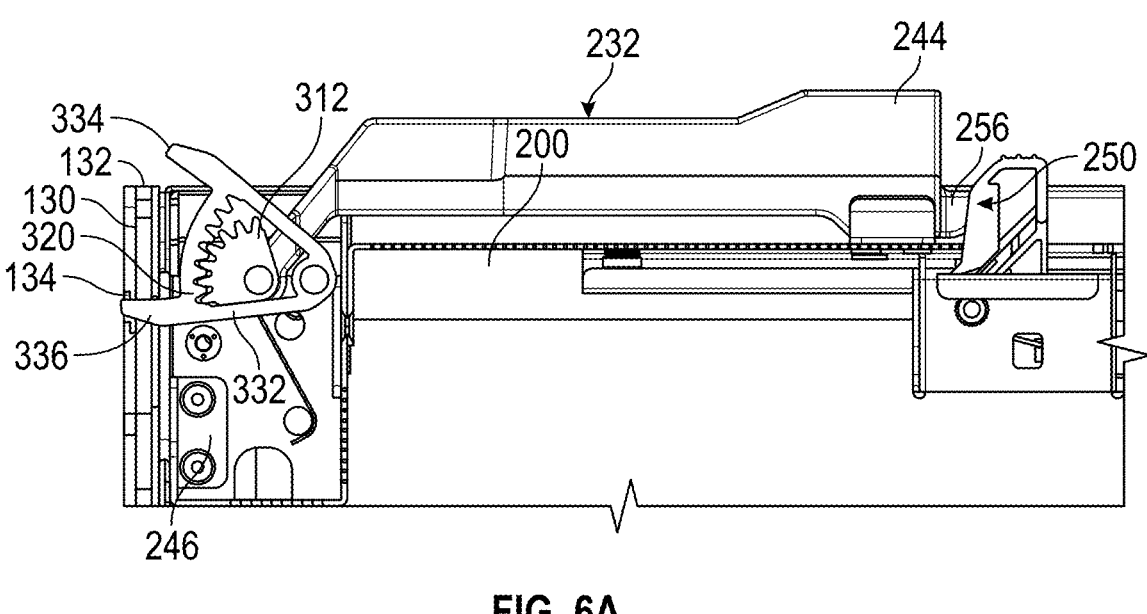
FIG. 6A-6F is series of views showing the positioning of the example lever mechanism in FIG. 2A between the open and closed positions, according to certain aspects of the present disclosure.
Figure 6B:
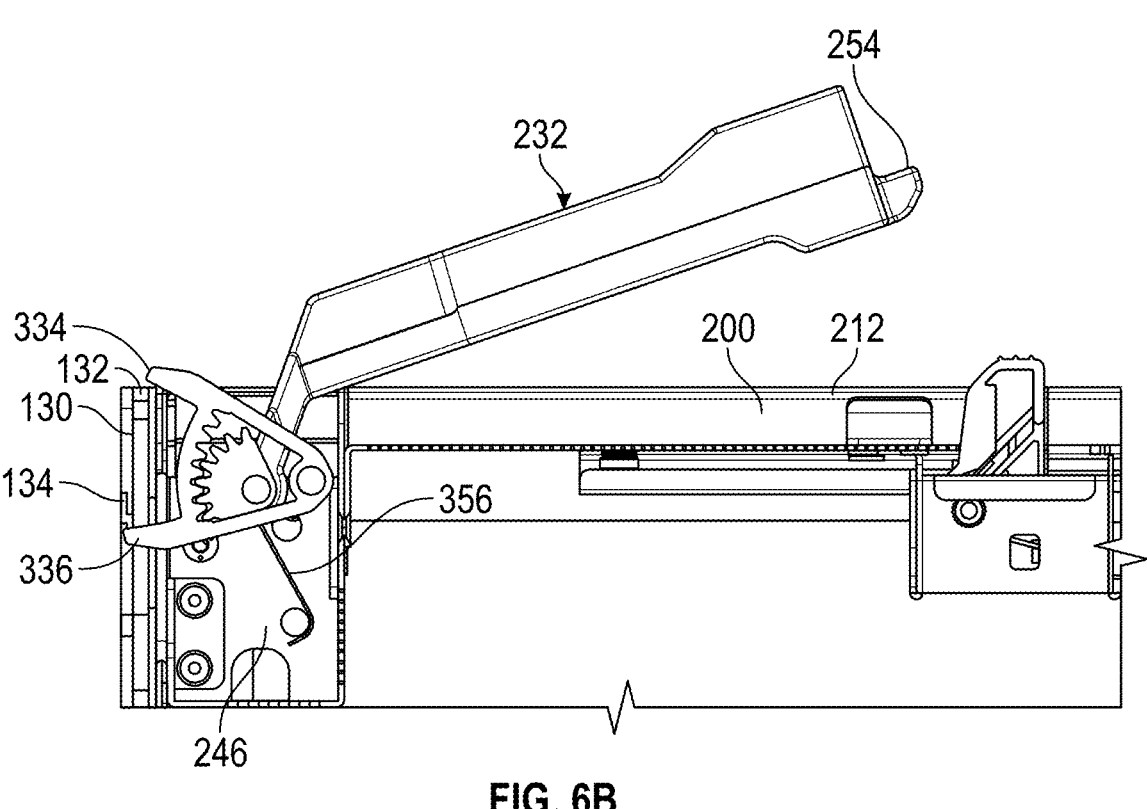
Figure 6C:
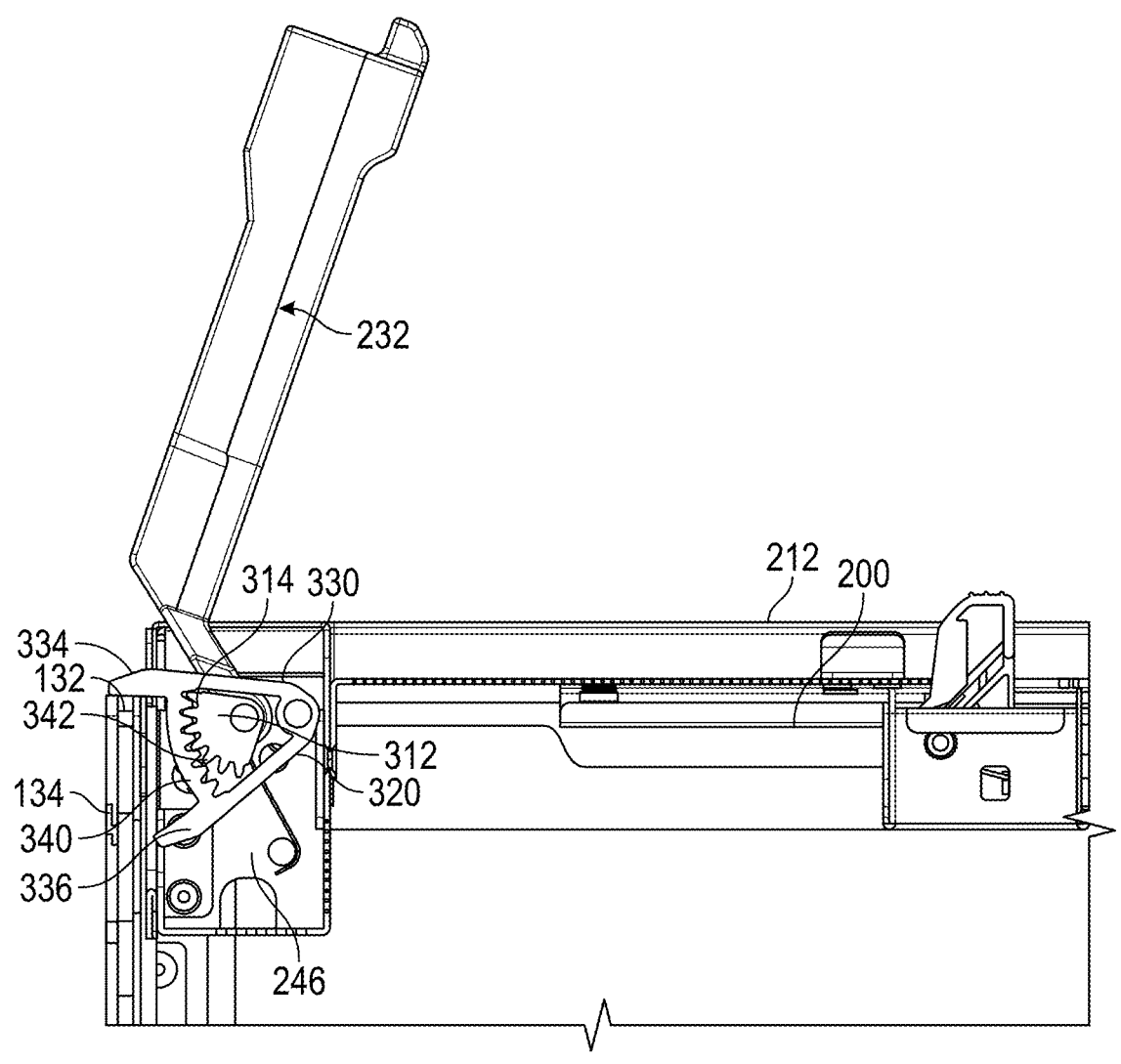

FIG. 6A-6C shows a sequence of the operation of the lever mechanism 232 in FIG. 2A that assists in releasing the sled 200. FIG. 6A shows the lever mechanism 232 in the closed position where the sled 200 is entirely inserted into the chassis 110. The tab 256 on the release end 244 is held by the latch mechanism 250. Thus, the longitudinal body member 240 prevents the rotation of the ejector component 320 by locking the spur gear 312 in place. In this position, the spur gear 312 rests against the support arm 332 of the ejector component 320. The tab 336 thus extends through the cutout 134 of the edge member 130. The support arm 332 and corresponding tab 334 are angled to position the tab 334 away from the flange 132 of the edge member 130.

FIG. 6B shows the lever mechanism 232 released by a user by rotating the latch mechanism 250, thus releasing the lever mechanism 232. The spring 356 causes the spur gear 312 to rotate counter-clockwise. The rotational movement of the spur gear 312 via meshing with the gear teeth on the interior surface 342 of the ejector component 320 causes the ejector component 320 to rotate counter-clockwise. The rotation of the spur gear 312 translates to the support strut 310 that causes the longitudinal body member 240 of the lever mechanism 232 to rotate counter-clockwise. Once the lever mechanism 232 is released, a user may pull the lever body away from the upper panel 212 via the handle 254. The rotation of the longitudinal body member 240 causes the spur gear 312 to rotate and thus rotate the ejector component 320. The rotation of the ejector component 320 causes the support arm 330 to rotates the tab 334 to contact the flange 132 of the side wall 120. Correspondingly, the support arm 332 rotates the tab 336 away from the cutout 134.

After the lever mechanism 232 is released, a user may fully rotate the lever mechanism 232 such that the longitudinal body member 240 is approximately perpendicular to the front end 210 of the sled 200. The position of the lever mechanism 232 after being fully rotated is shown in FIG. 6C. The motion of the lever mechanism 232 causes the spur gear 312 to rotate counter-clockwise. As the spur gear 312 is rotating, the gear teeth on the semi-circular edge 314 mesh with the gear teeth on the interior surface 342 of the internal gear member 340. As the spur gear 312 rotates, it contacts the support arm 330 of the ejector component 320. The further rotation of the spur gear 312 translates motion via the meshing gear teeth and causes the ejector component 320 to rotate counter-clockwise. The rotation of the ejector component 320 causes the tab 334 to contact the flange 132. The force applied on the flange 132 via the tab 334 causes the sled 200 to be pushed away from the bay. The force assists in unplugging the connectors at the rear of the sled 200 from the bay of the chassis. Once the connectors are disconnected, a user may slide the sled 200 all the way out of the bay 128.

Figure 6D:
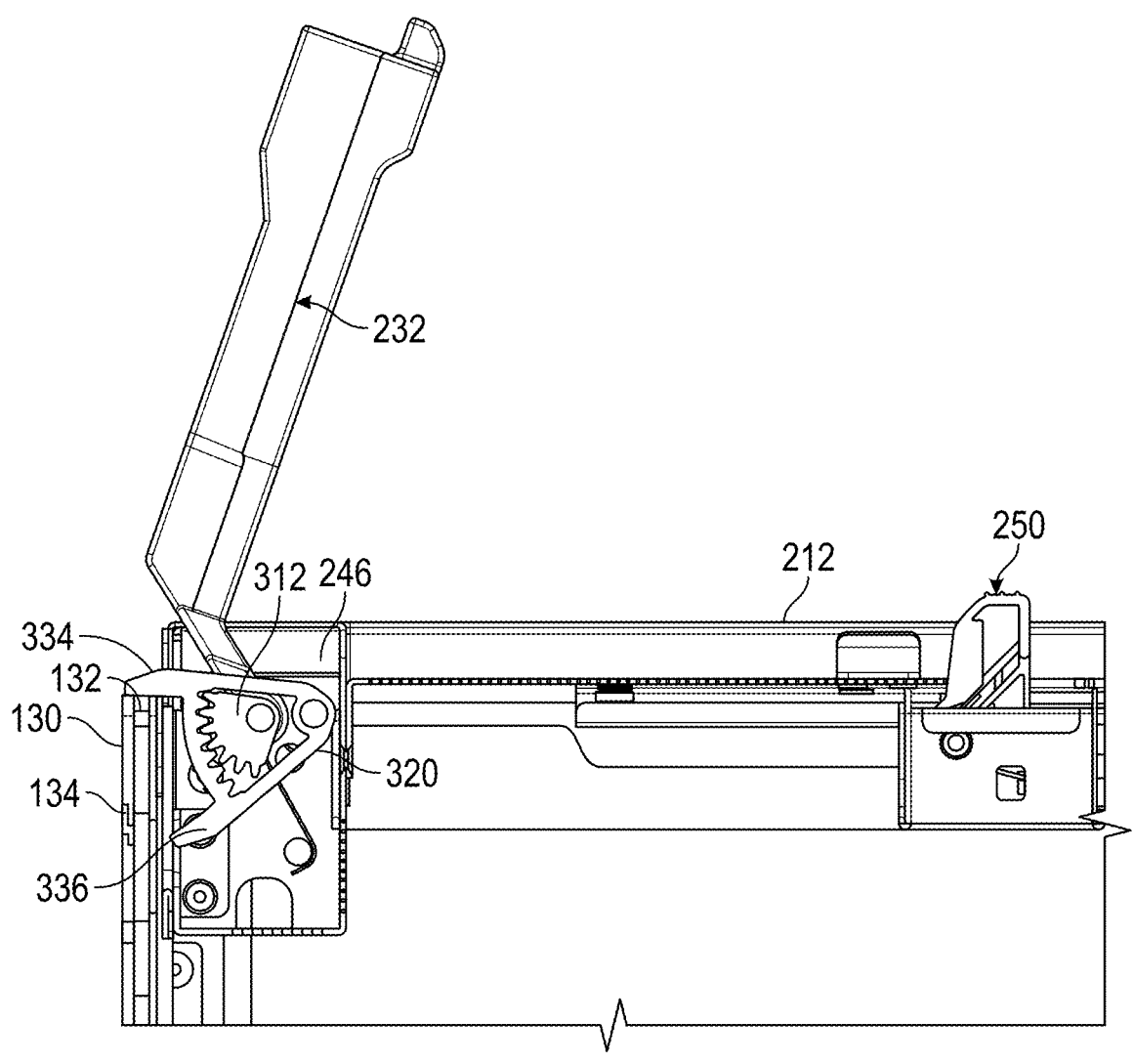
Figures 6E, 6F:
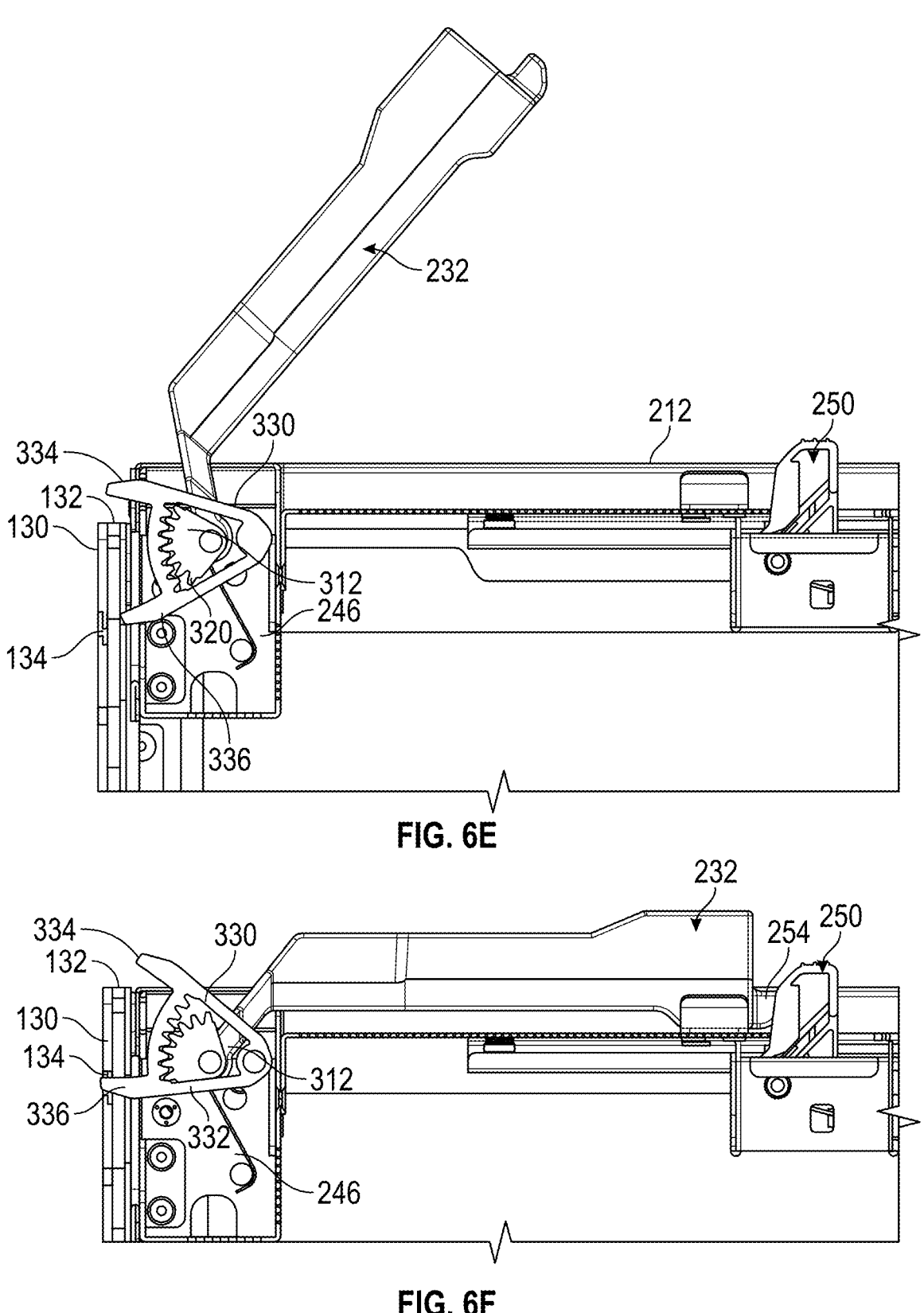

FIGS. 6D-6F shows a sequence of the operation of the lever mechanism 232 to assist in inserting the sled 200 in the bay 128 of the chassis 110. As shown in FIG. 6D, the sled 200 is initially partially inserted into the bay 128. The lever mechanism 232 is pulled out to the fully open position as shown in FIG. 6D. The rotational position of the lever mechanism 232 causes the tab 334 to be rotated to a perpendicular position relative to the flange 132. The sled 200 may be pushed into the bay to a position where the connectors of the sled are partially inserted in the corresponding chassis connectors. When the sled 200 is in such a position, the tab 334 contacts the flange 132. Due to the rotational position of the ejector component 320, the tab 336 is rotated to a position that does not interfere with the edge member 130 and allows movement of the sled 200 into the bay 128.

Once the sled 200 is inserted in the bay 128 in the position shown in FIG. 6D, the user will push the lever mechanism 232 clockwise toward the upper panel 212 as shown in FIG. 6E. Rotating the lever mechanism 232 toward the upper panel 212 causes the spur gear 312 to rotate clockwise from the initial position in contact with the support arm 330. This causes the ejector component 320 to rotate clockwise thus moving the tab 334 away from the flange 132 and moving the tab 336 into the cutout 134. As the lever mechanism 232 is moved to the closed position, the tab 336 contacts the side of the cutout 134 and thus applies force against the side of the cutout 134 to push the sled 200 into the bay. The additional force applied through the lever mechanism 232 assists in fully connecting the connectors on the end of the sled 200 with the corresponding connectors in the chassis.

FIG. 6F shows the sled 200 fully inserted into the bay 128 of the chassis. In this position, the lever mechanism 232 is locked in the closed position by the tab 256 being held by the latch mechanism 250. The spur gear 312 has been fully rotated to rest against the support arm 332. The additional travel of the spur gear 312 causes the ejector component 320 to rotate and thus translate force to linearly push the sled 200 into the bay 128.

Figure 7A:
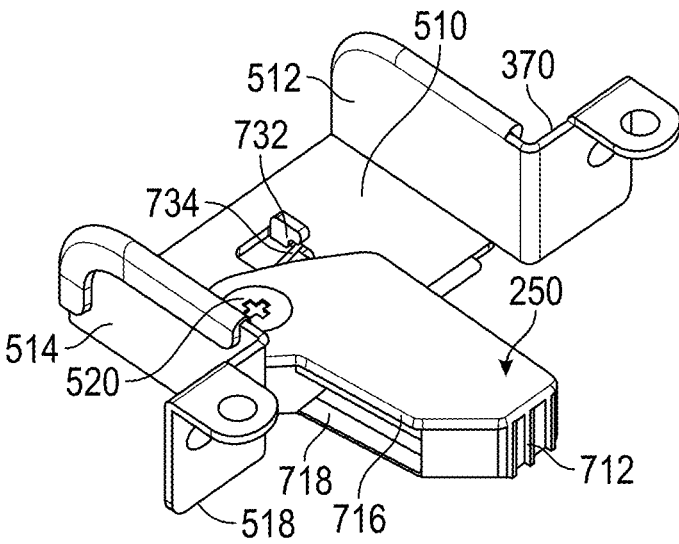
FIG. 7A is a perspective view of the latch mechanism of the example lever mechanism in FIG. 2A, according to certain aspects of the present disclosure.
Figure 7B:
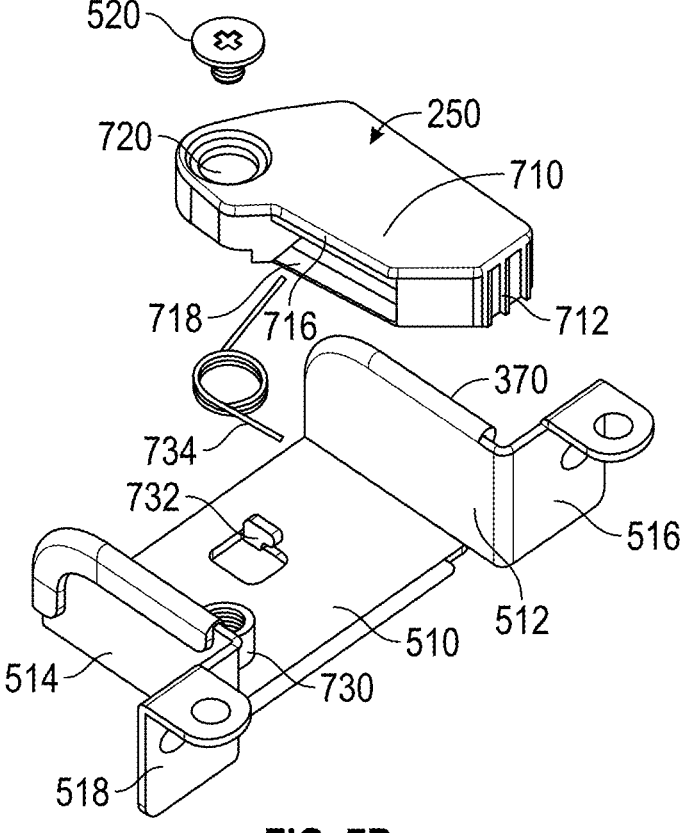
FIG. 7B is an exploded perspective view of the latch mechanism of the example lever mechanism in FIG. 2A, according to certain aspects of the present disclosure.

FIG. 7A is a perspective view of the latch mechanism 250 attached to the mounting bracket 370. FIG. 7B is an exploded perspective view of the components of the latch mechanism 250 and the mounting bracket 370. The latch mechanism 250 has a generally rectangular main body 710. In this example, the main body 710 may be plastic, but other suitable materials may be used. The main body 710 includes a ridged edge 712 that allows a user to better contact the main body 710 to rotate the latch mechanism 250. The main body 710 includes a contact edge 716 that includes a slot 718. The slot 718 engages the tab 256 of the lever mechanisms such as the lever mechanism 232 in FIG. 2B. The main body 710 includes a circular hole 720 that is placed over a cylindrical support 730 that extends from the plate 510. The cylindrical support 730 may be attached to the screw 520 that holds the main body 710 on the cylindrical support 730. The main body 710 thus may rotate on the cylindrical support 730.

The plate 510 has a hook 732 that allows attachment of one end of a coil spring 734. The coil of the coil spring 734 is wrapped around the cylindrical support 730. Thus, the spring force of the coil spring 734 rotates the main body 710 in a clockwise direction to lock the tab 256 of the lever mechanism. A user may rotate the main body 710 counter-clockwise to release the tab 256 and thus allow the lever mechanism to freely rotate.

Figure 8A:
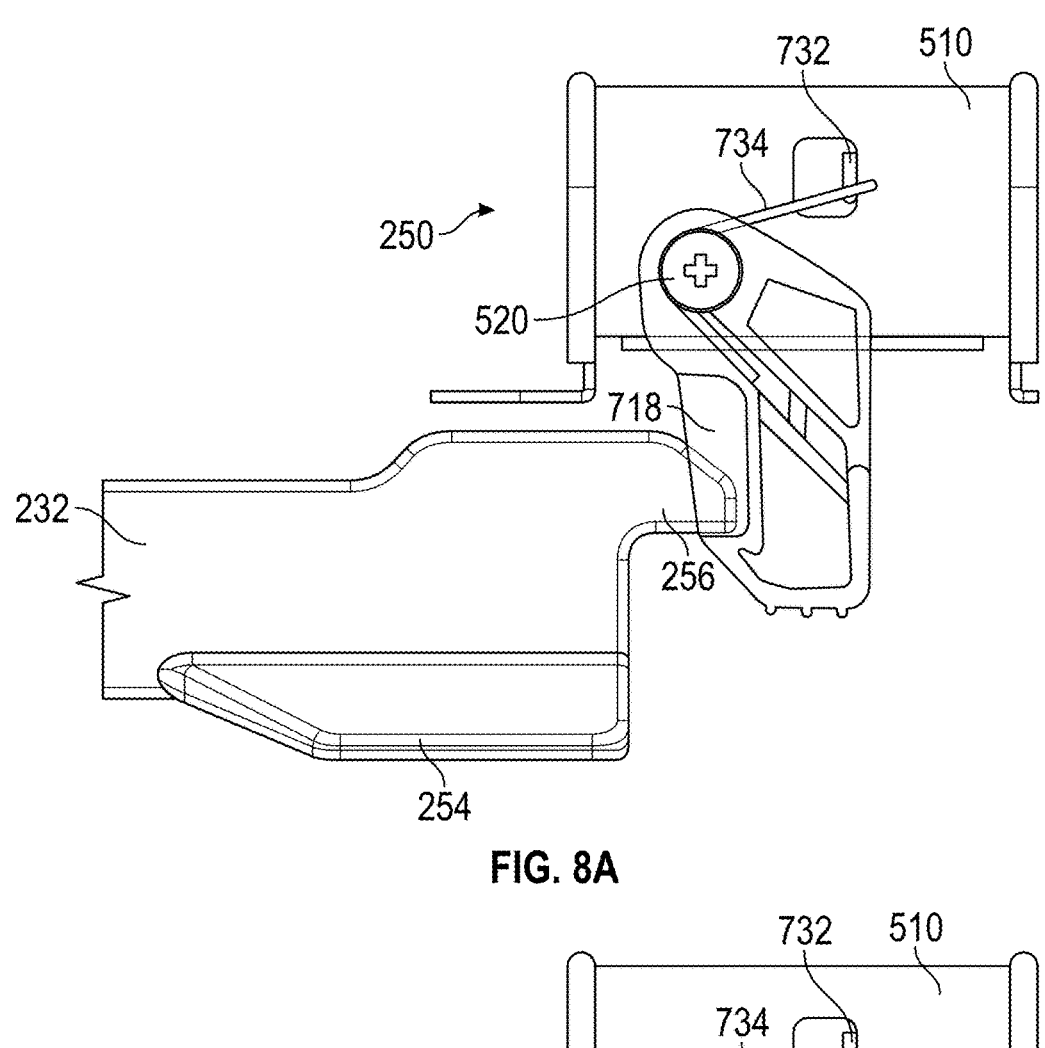
FIGS. 8A-8B are views of the latch mechanism in FIG. 7A in locked and unlocked positions, according to certain aspects of the present disclosure.

FIG. 8A shows the latch mechanism 250 in the locked position that holds the lever mechanism 232 in the closed position. As shown in FIG. 8A, the spring force from the coil spring 734 forces the main body 710 to be rotated clockwise around the cylindrical support 730 and screw 520. In this position, the slot 718 engages the tab 256 of the lever mechanism 232 and holds the lever mechanism 232 in place.

Figure 8B:
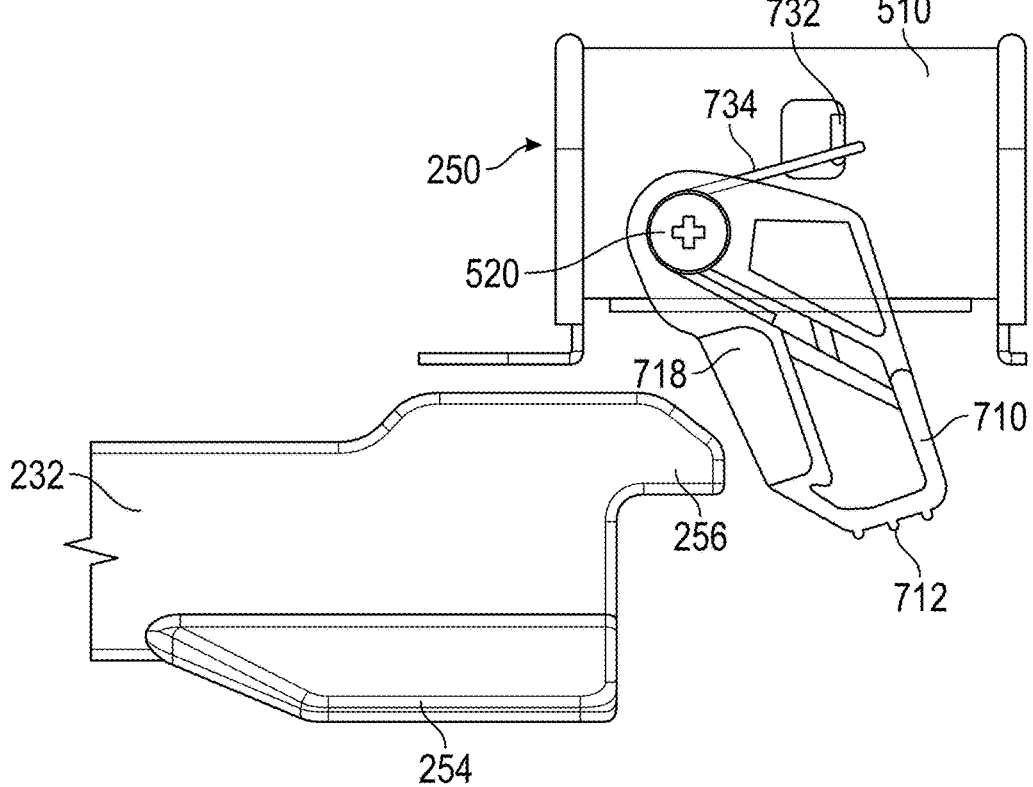

FIG. 8B shows the example latch mechanism 250 in the released position. A user may release the lever mechanism by pressing the ridged edge 712 and rotating the main body in a counter-clockwise direction. This compresses the coil spring 734, but releases the tab 256 from the slot 718, allowing the lever mechanism 230 to be rotated away from the sled 200.

Figure 9A:
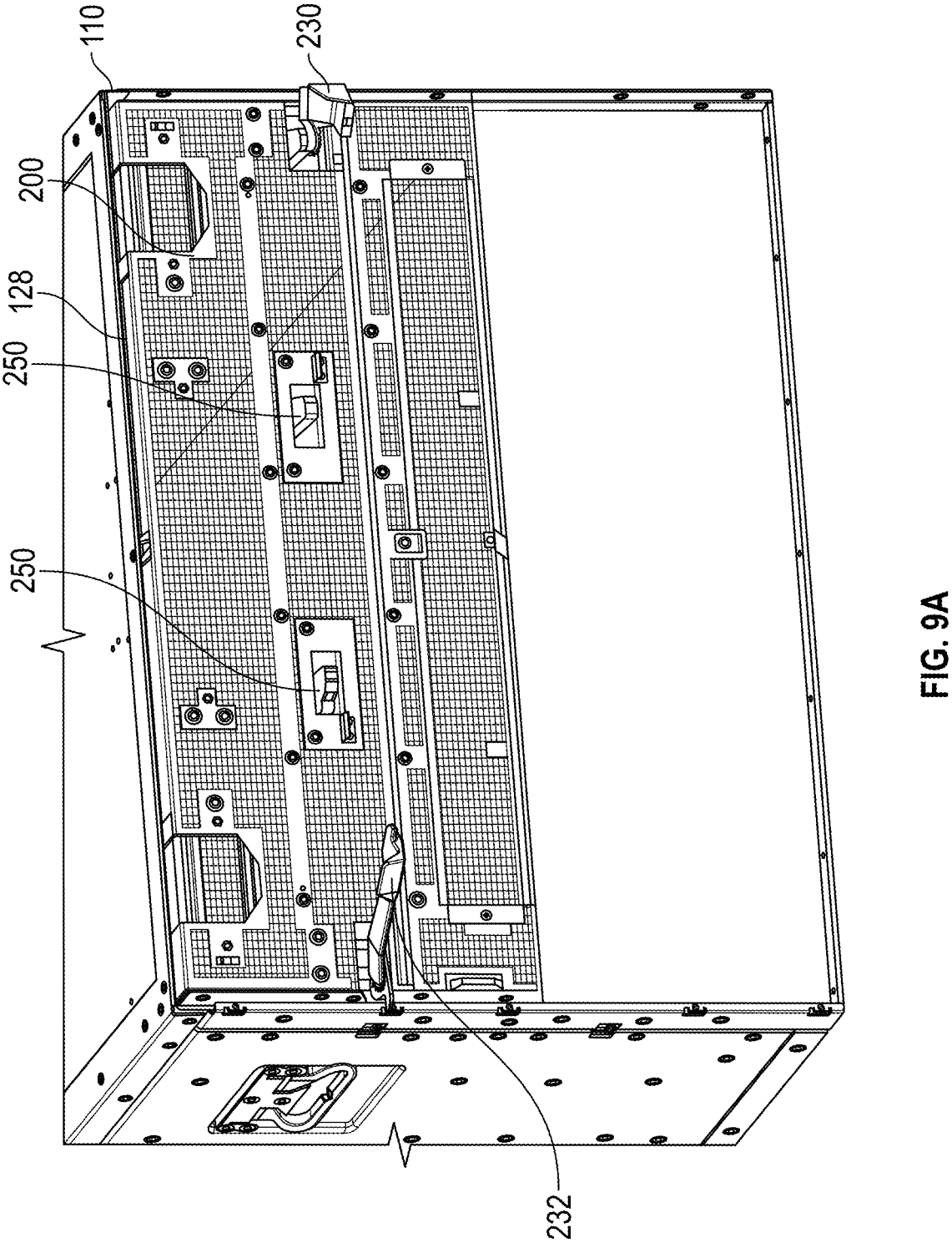
FIGS. 9A-9C show the sequence of removing a sled from the server chassis using the example lever mechanisms, according to certain aspects of the present disclosure.
Figure 9B:
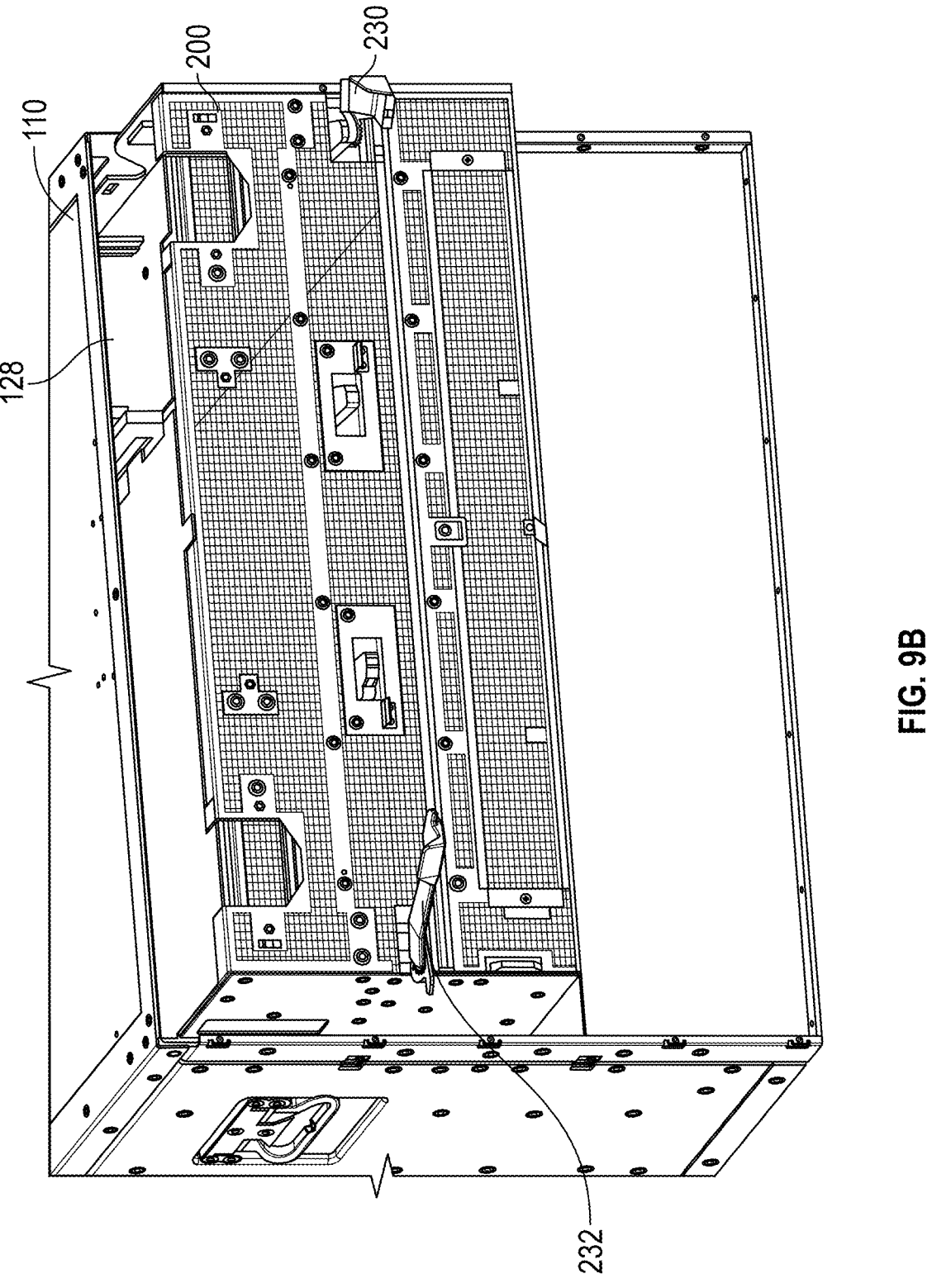
Figure 9C:
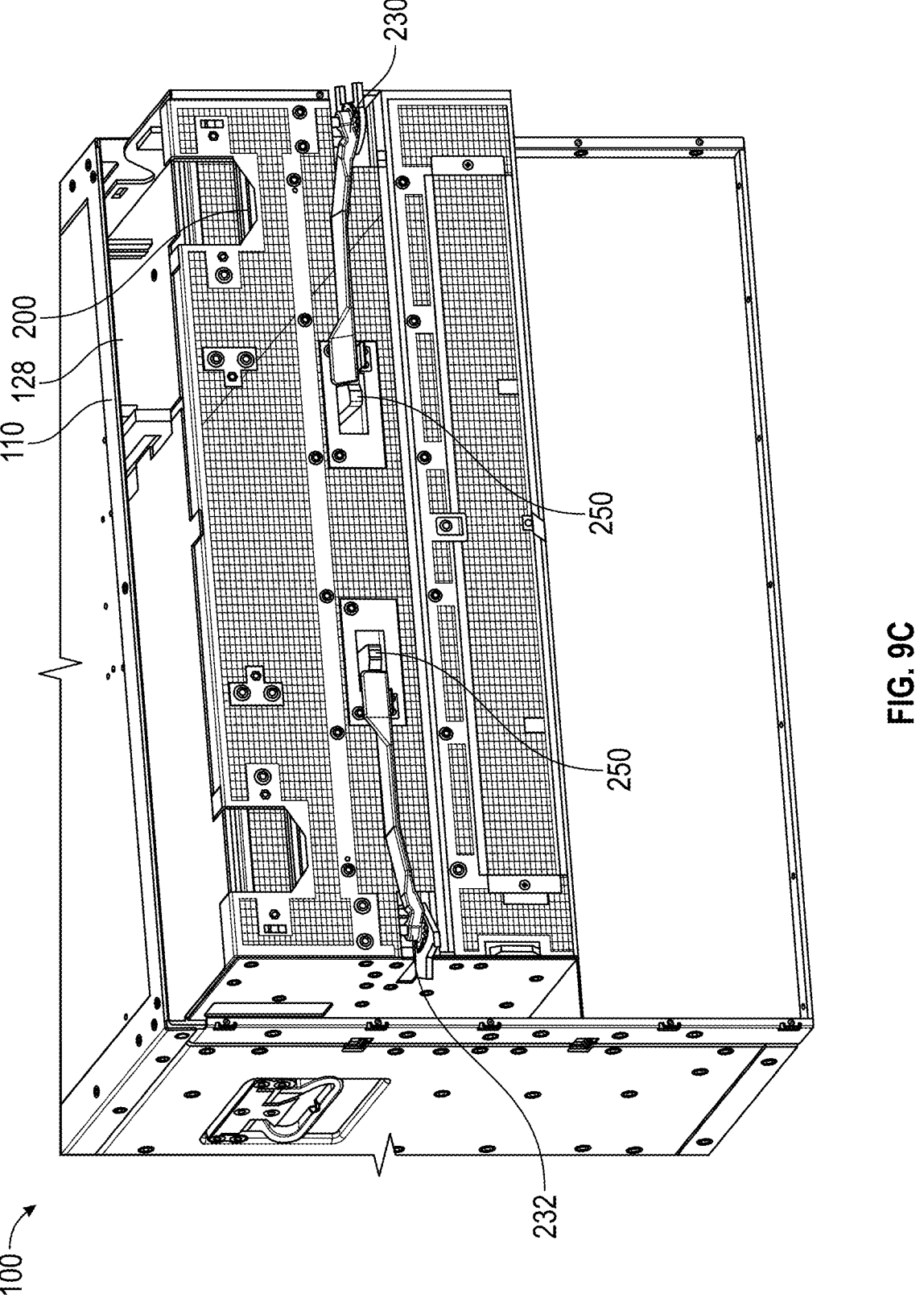

FIGS. 9A-9C show the sequence of removing the sled 200 from the server chassis 110 using the example lever mechanisms 230 and 232. As shown in FIG. 9A, the lever mechanisms 230 and 232 have been released from the latch mechanisms 250. The lever mechanisms 230 and 232 thus may be rotated to the open position to assist in disconnecting the sled 200 from the connectors in the bay 128 of the chassis 110.

As the example lever mechanism 230 and 232 allow additional force to be applied to disconnect the connectors, the sled 200 may be pulled out of the bay 128 of the chassis 110 as shown in FIG. 9B. The lever mechanism 230 and 232 are still rotated outward.

Once the sled 200 is pulled out of the bay 128, the lever mechanisms 230 and 232 are no longer needed and thus can be rotated to the closed position. The user thus locks the lever mechanisms 230 and 232 in the closed position by locking them with the latch mechanisms 250 as shown in FIG. 10C. The sled 200 may thus be transported without damaging the lever mechanisms 230 and 232.

Figure 10A:
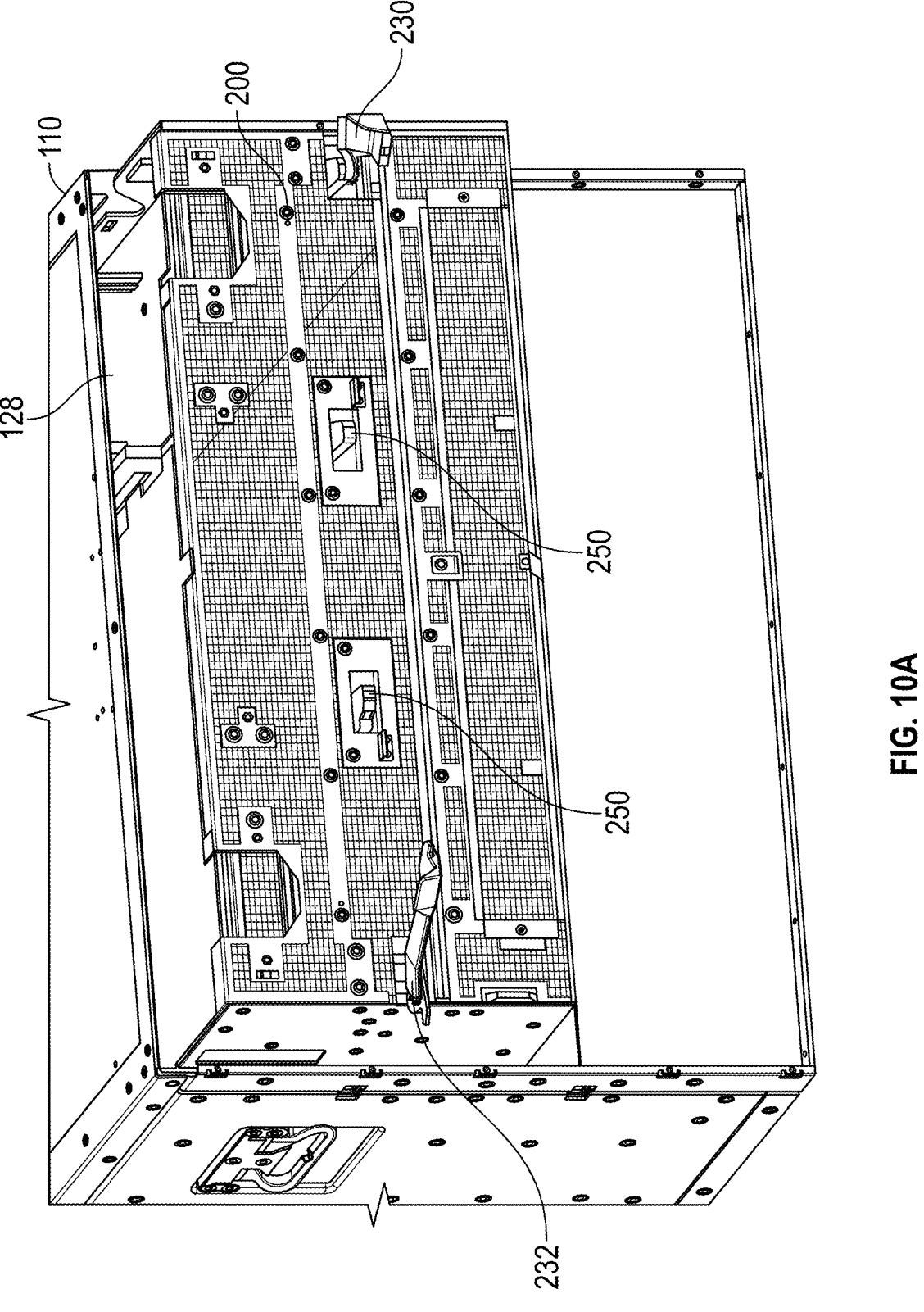
FIGS. 10A-10C show the sequence of inserting a sled into the server chassis using the example lever mechanisms, according to certain aspects of the present disclosure.
Figure 10B:
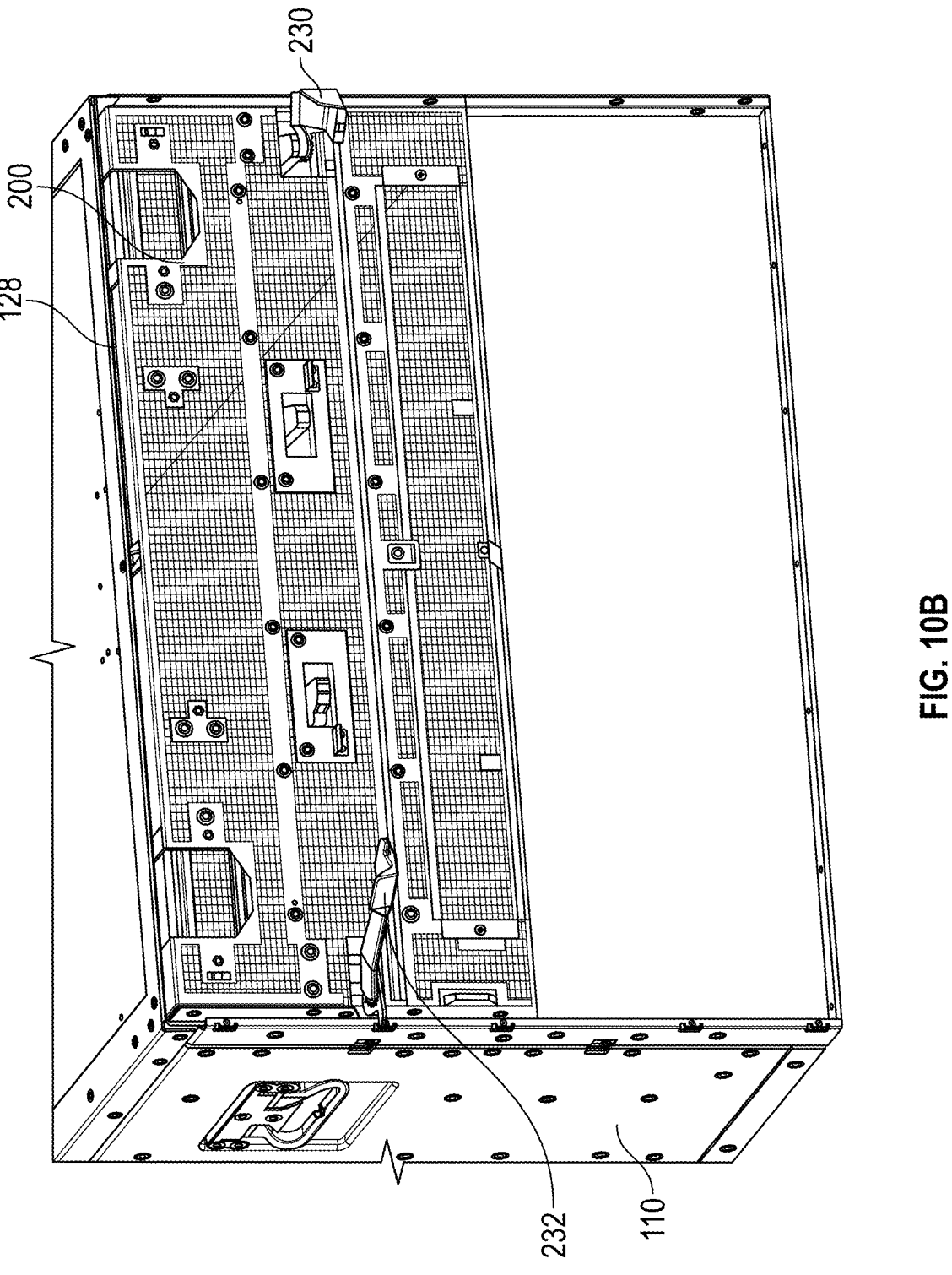
Figure 10C:
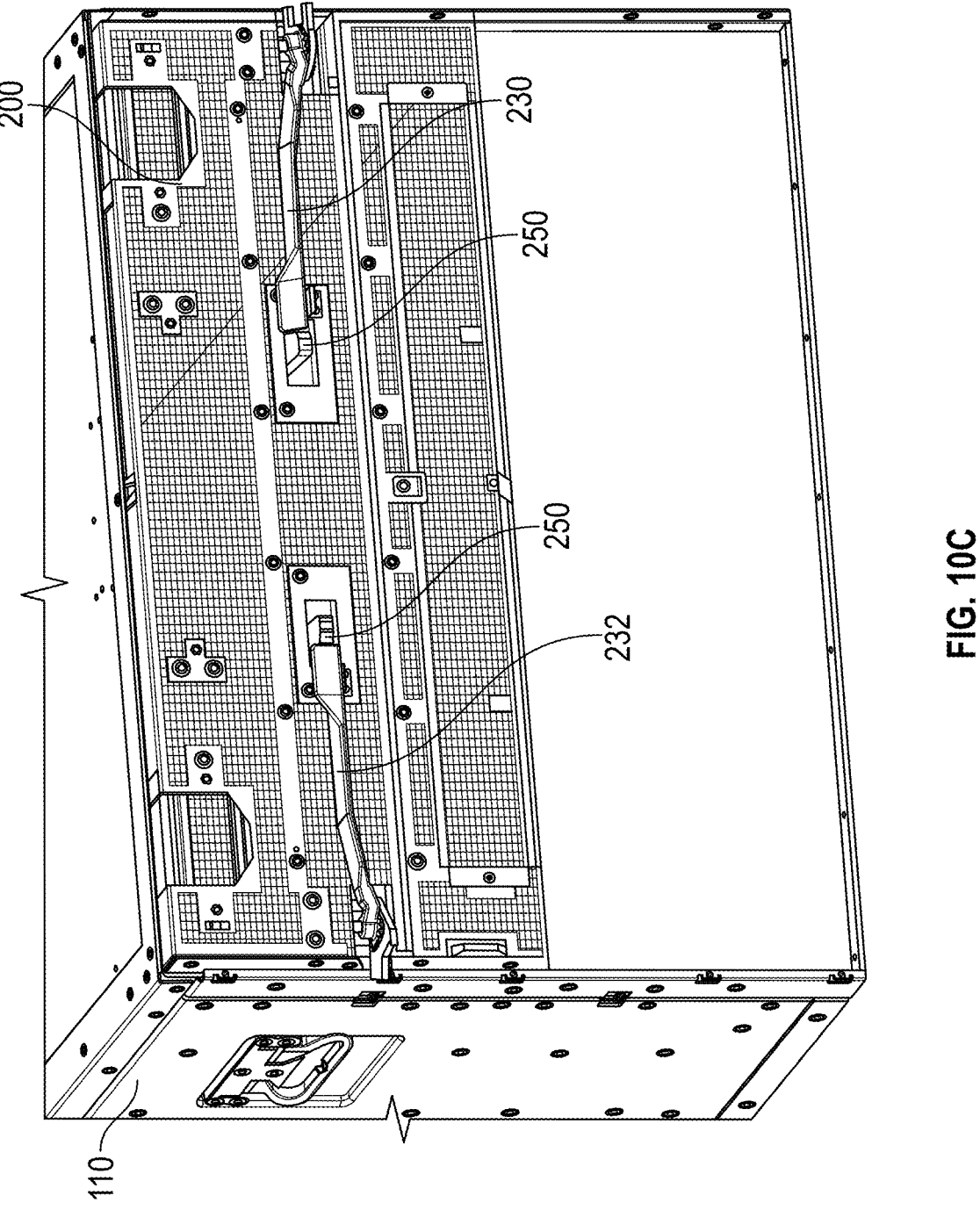

FIGS. 10A-10C show the sequence of inserting the sled 200 into the server chassis 110 using the example lever mechanisms 230 and 232. As shown in FIG. 10A, the sled 200 is initially partially inserted in the bay 128 of the chassis 110. The lever mechanisms 230 and 232 may be released so the lever mechanisms 230 and 232 rotate away from the sled 200.

When the sled 200 is mostly inserted in the bay 128, the lever mechanisms 230 and 232 may be rotated toward the closed position as shown in FIG. 10B. The lever mechanisms 230 and 232 allow additional force to be applied to push the connectors of the sled 200 to fully engage the connectors of the chassis 110 in the rear end of the bay 128. Once the sled 200 is fully inserted in the bay 128, the lever mechanisms 230 and 232 are rotated to the fully closed position and are locked in place by the respective latch mechanisms 250 as shown in FIG. 10C.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A lever mechanism for insertion to and removal of a sled from a chassis, the lever mechanism comprising:
a longitudinal lever member having a release end and an opposite pivot end;
a spur gear having gear teeth coupled to the pivot end of the longitudinal lever member, wherein the spur gear is rotated by rotating the longitudinal lever member; and
an ejector component rotatably connectable to the sled, the ejector component having a frame defined by an internal gear support, a first support arm, and a second support arm, wherein the spur gear is positioned within the frame and engages gear teeth on an interior surface of the internal gear support to rotate the ejector component, wherein the first support arm is connected to an end of the internal gear support, and includes a first tab extending from an opposite exterior surface of the internal gear support for engaging a flange of the chassis to apply force to remove the sled from the chassis when the longitudinal lever member is rotated in a first direction and the second support arm is connected to an opposite end of the internal gear support, and includes a second tab extending from the opposite exterior surface of the internal gear support for engaging a cutout of the chassis to apply force to insert the sled in the chassis when the longitudinal lever member is rotated in a second direction, and wherein the gear teeth of the interior surface of the internal gear support face away from the first and second tabs.

2. The lever mechanism of claim 1, further comprising:
a support plate rotatably attached to the spur gear and ejector component; and
a spring having one end connected to the support plate and an opposite end connected to the spur gear, the spring biasing the spur gear in a first rotational direction.

3. The lever mechanism of claim 1, wherein the release end of the longitudinal lever member includes a tab that engages a latch mechanism on the sled to hold the longitudinal lever member in place.

4. The lever mechanism of claim 3, wherein the latch mechanism rotates between a position engaging the tab and a position releasing the tab.

5. The lever mechanism of claim 1, wherein the release end of the longitudinal lever member includes a handle.

6. The lever mechanism of claim 1, wherein the spur gear is connected to a cylindrical support, and wherein the longitudinal lever member is connected to the cylindrical support.

7. The lever mechanism of claim 1, wherein the longitudinal lever member, the spur gear, and the ejection component generate force to disconnect connectors of the sled from connectors of the chassis when rotated in the first direction.

8. The lever mechanism of claim 1, wherein the spur gear has a triangular shape defined by a distal semi-circular edge with gear teeth, and two sides having respective ends each coupled to the distal semi-circular edge, the two sides having opposites ends joined to define a proximal apex point with hole holding a pin to rotationally attach the spur gear to the pivot end of the longitudinal lever member.

9. A sled for insertion into a bay of a chassis defined by two edge members each having a flange and a cutout, the sled comprising:
a tray holding electronic components;
a front panel coupled perpendicularly to the tray; and
a first lever mechanism mounted on a side of the front panel, the first lever mechanism including:
a longitudinal lever member having a release end and an opposite pivot end;
a spur gear having gear teeth coupled to the pivot end of the longitudinal lever member, wherein the spur gear is rotated by rotating the longitudinal lever member; and
an ejector component rotatably connected to the sled, the ejector component having a frame defined by an internal gear support, a first support arm, and a second support arm, wherein the spur gear is positioned within the frame and engages gear teeth on an interior surface of the internal gear support to rotate the ejector component, wherein the first support arm is connected to an end of the internal gear support, and includes a first tab extending from an opposite exterior surface of the internal gear support for engaging one of the flanges to apply force to remove the sled from the bay when the longitudinal lever member is rotated in a first direction and the second support arm is connected to an opposite end of the internal gear support, and includes a second tab extending from the opposite exterior surface of the internal gear support for engaging one of the cutouts to apply force to insert the sled in the bay when the longitudinal lever member is rotated in a second direction, and wherein the gear teeth of the interior surface of the internal gear support face away from the first and second tabs.

10. The sled of claim 9, further comprising a second lever mechanism mounted on an opposite side of the front panel, the second lever mechanism including:
a longitudinal lever member having a release end and an opposite pivot end;
a spur gear having gear teeth coupled to the pivot end of the longitudinal lever member, wherein the spur gear is rotated by rotating the longitudinal lever member; and
an ejector component rotatably connected to the sled, the ejector component having a frame defined by an internal gear support, a first support arm, and a second support arm, wherein the spur gear is positioned within the frame and engages the internal gear support to rotate the ejector component, wherein the first support arm includes a tab engaging the other one of the flanges to apply force to remove the sled from the bay when the longitudinal lever member is rotated in the first direction and the second support arm includes a second tab engaging the other one of the cutouts to apply force to insert the sled in the bay when the longitudinal lever member is rotated in the second direction.

11. The sled of claim 10, wherein the first and second lever mechanisms generate sufficient force to disconnect connectors of the sled from connectors of the bay when rotated in the first direction.

12. The sled of claim 9, further comprising:
a support plate rotatably attached to the spur gear and ejector component; and
a spring having one end connected to the support plate and an opposite end connected to the spur gear, the spring biasing the spur gear in a first rotational direction.

13. The sled of claim 9, further comprising a latch mechanism on the front panel, wherein the release end of the longitudinal lever member includes a tab that engages the latch mechanism to hold the longitudinal lever member in place.

14. The sled of claim 13, wherein the latch mechanism rotates between a position engaging the tab and a position releasing the tab.

15. The sled of claim 9, wherein the release end of the longitudinal lever member includes a handle.

16. The sled of claim 9, wherein the spur gear is connected to a cylindrical support, and wherein the longitudinal lever member is connected to the cylindrical support.

17. The sled of claim 9, wherein the spur gear has a triangular shape defined by a distal semi-circular edge with gear teeth, and two sides having respective ends each coupled to the distal semi-circular edge, the two sides having opposites ends joined to define a proximal apex point with hole holding a pin to rotationally attach the spur gear to the pivot end of the longitudinal lever member.

18. A computer system comprising:
a chassis having two side walls, a shelf between the two side walls, and a bay defined by the two side walls and the shelf, each of the two side walls having edge members with longitudinal flanges; and
a sled insertable in the bay of the chassis between the two side walls, wherein the sled includes a front panel, a tray, and a rotating lever mechanism on the front panel, the rotating lever mechanism including:
a longitudinal lever member having a release end and an opposite pivot end;
a spur gear having gear teeth coupled to the pivot end of the longitudinal lever member, wherein the spur gear is rotated by rotating the longitudinal lever member; and
an ejector component rotatably connected to the sled, the ejector component having a frame defined by an internal gear support, a first support arm, and a second support arm, wherein the spur gear is positioned within the frame and engages gear teeth on an interior surface of the internal gear support to rotate the ejector component, wherein the first support arm is connected to an end of the internal gear support, and includes a first tab extending from an opposite exterior surface of the internal gear support for engaging one of the longitudinal flanges to apply force to remove the sled from the bay when the longitudinal lever member is rotated in a first direction and the second support arm is connected to an opposite end of the internal gear support, and includes a second tab extending from the opposite exterior surface of the internal gear support for engaging a cutout on one of the two side walls to apply force to insert the sled in the bay when the longitudinal lever member is rotated in a second direction, and wherein the gear teeth of the interior surface of the internal gear support face away from the first and second tabs.

* * * * *